United States Patent
Liaw

(10) Patent No.: US 8,964,455 B2
(45) Date of Patent: Feb. 24, 2015

(54) STRUCTURE AND METHOD FOR A SRAM CIRCUIT

(75) Inventor: Jhon Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 281 days.

(21) Appl. No.: 13/414,323

(22) Filed: Mar. 7, 2012

(65) Prior Publication Data

US 2013/0235652 A1  Sep. 12, 2013

(51) Int. Cl.
*G11C 11/00* (2006.01)
(52) U.S. Cl.
USPC .............................. 365/156; 365/49; 365/154
(58) Field of Classification Search
USPC .......................................... 365/156, 154, 49
See application file for complete search history.

(56) References Cited

U.S. PATENT DOCUMENTS

| 6,157,558 | A  | * | 12/2000 | Wong ........................ 365/49.11 |
| 7,405,994 | B2 | * | 7/2008  | Liaw ........................ 365/230.05 |
| 2011/0222332 | A1 | | 9/2011 | Liaw et al. |
| 2011/0317477 | A1 | | 12/2011 | Liaw et al. |
| 2011/0317485 | A1 | | 12/2011 | Liaw et al. |
| 2012/0001197 | A1 | | 1/2012 | Liaw et al. |
| 2012/0001232 | A1 | | 1/2012 | Liaw et al. |

* cited by examiner

*Primary Examiner* — Son Dinh
(74) *Attorney, Agent, or Firm* — Haynes and Boone, LLP

(57) ABSTRACT

The present disclosure provides an integrated circuit formed in a semiconductor substrate. The integrated circuit includes a first static random access memory (SRAM) cell having a first cell size; and a second SRAM cell having a second cell size greater than the first cell size. The first SRAM cell includes first n-type field effect transistors (nFETs) each having a first gate stack. The second SRAM cell includes second nFETs each having a second gate stack different from the first gate stack.

20 Claims, 17 Drawing Sheets

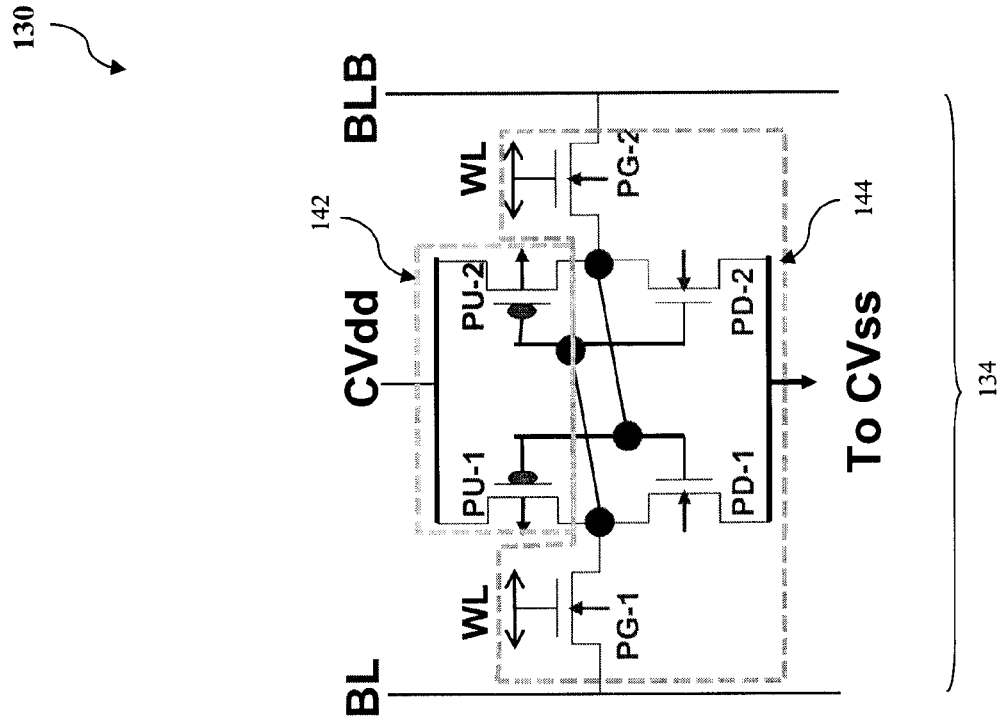
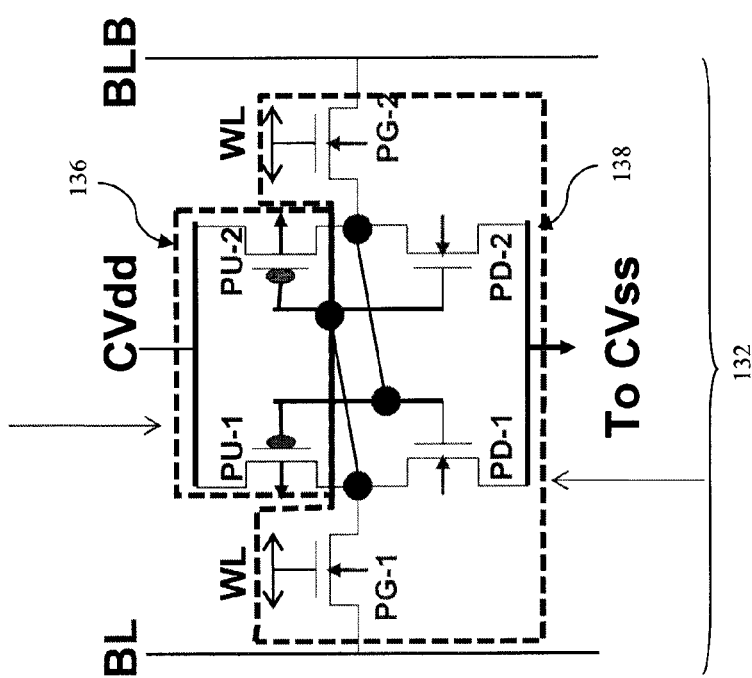
Fig. 6

STRUCTURE AND METHOD FOR A SRAM CIRCUIT

CROSS REFERENCE

The present disclosure is related to the following commonly-assigned U.S. patent applications, the entire disclosures of which are incorporated herein by reference: U.S. patent application Ser. No. 12/721,476 filed Mar. 10, 2010 by the same inventor Jhon Jhy Liaw for "FULLY BALANCED DUAL-PORT MEMORY CELL"; U.S. patent application Ser. No. 12/823,907 filed Jun. 25, 2010 by Jhon Jhy Liaw for "CELL STRUCTURE FOR DUAL-PORT SRAM"; U.S. patent application Ser. No. 12/827,406 filed Jun. 30, 2010 by Jhon Jhy Liaw for "ROM CELL CIRCUIT FOR FINFET DEVICES"; U.S. patent application Ser. No. 12/823,860 filed Jun. 25, 2010 by Jhon Jhy Liaw for "STRUCTURE AND METHOD ROM SRAM CELL CIRCUIT"; and U.S. patent application Ser. No. 12/827,690 filed Jun. 30, 2010 by Jhon Jhy Liaw for "LAYOUT FOR MULTIPLE-FIN SRAM CELL".

BACKGROUND

In deep sub-micron integrated circuit technology, an embedded static random access memory (SRAM) device has become a popular storage unit of high speed communication, image processing and system-on-chip (SOC) products. For example, a fin transistor, such as a fin field-effect transistor (FinFET), is introduced to replace a planar transistor and is used to form a SRAM device. The fin transistor has a channel (referred to as a fin channel) associated with a top surface and opposite sidewalls. The fin channel has a total channel width defined by the top surface and the opposite sidewalls. In advanced technology nodes, such as 32 nm or beyond, a FinFET is advantageous to the planar transistor because of its lower leakage.

In a SRAM cell, such as a SRAM cell with 6 transistors (6T-SRAM), the layout with the beta ratio close to 1 provides a reduced cell size. In this situation, the pull-down devices and the pass-gate devices have a same device dimension. In a SRAM cell using FinFETs, a single fin size for all transistors can provide the minimized cell size. As to a high speed application, equal numbers of pull-down devices and of pass-gate devices provide a proper tradeoff between the cell speed and the cell size. In this situation, the beta ratio is equal to or less than one. However, this will lead to various beta ratio associated issues such as current crowding.

When the alpha ratio is higher, the write margin is degraded. When the alpha ratio is lower, the read stability margin is degraded. The existing approaches are not capable of tuning the alpha ratio for optimized read stability and write margin. Other issues associated with the existing methods and structures include SRAM cell stability and device density. Various barriers may present in FinFET SRAM design. For example, there is no freedom on co-optimization of cell size, cell current and Vcc. In another example, the cell size is digitized and that impacts to the Vcc optimization. In a further example, the extra process steps introduce additional fabrication cost. Therefore, it is desired to have a new structure and a method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6 is a schematic view of an integrated circuit having various SRAM cells constructed according to various aspects of the present disclosure in another embodiment.

DETAILED DESCRIPTION

Figure 1:
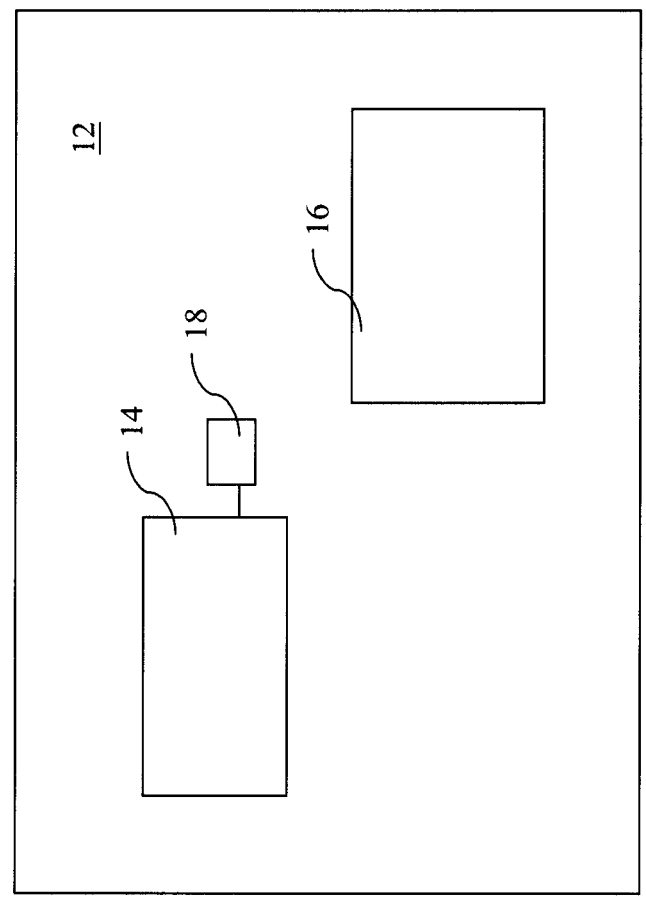
FIG. 1 is a schematic view of an integrated circuit having various SRAM cells constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram illustrating an integrated circuit 10 formed on a substrate 12. The substrate 12 is a semiconductor substrate in the present embodiment. The semiconductor substrate 12 includes silicon. Alternatively, the substrate includes germanium, silicon germanium or other proper semiconductor materials. The semiconductor substrate 12 also includes various isolation features such as shallow trench isolation (STI) formed in the substrate to separate various devices. The semiconductor substrate also includes various doped regions such as n-well and p-wells.

The integrated circuit 10 includes a plurality of SRAM cells configured in array for proper data accessing. In one embodiment, the integrated circuit 10 includes a first SRAM cell 14 having a first cell size and a second SRAM cell 16 having a second cell size greater than the first cell size. In another embodiment, the integrated circuit 10 includes a plurality of first SRAM cells having the first cell size and configured in a first array and a plurality of second SRAM cells having the second cell size and configured in a second array. In one example, the second cell size is at least 10% greater than the first cell size.

The first SRAM cell 14 and the second SRAM cell 16 are similar since each includes two pull-up devices and two pull-down devices configured as two cross-coupled inverters for data storage and further includes two pass-gate devices coupled with the inverters for data accessing. In the present embodiment, the pull-up devices are formed with p-type field effect transistors (pFETs); and the pull-down devices and pass-gate devices are formed with n-type field effect transistors (nFETs).

However, the first SRAM cell 14 and the second SRAM cell 16 are different from each other by using different number of transistors. In the present embodiment, the first SRAM cell 14 includes a first number N1 of nFETs for the pull-down devices and the pass-gate devices; and the second SRAM cell 16 includes a second number N2 of nFETs for the pull-down devices and the pass-gate devices. The second number N2 is greater than the first number N1. In one embodiment, the alpha ratio for the first SRAM cell 14 ranges between 0.8 and 1.4 and the alpha ratio for the second SRAM cell 16 ranges between 0.2 and 0.6. The alpha ratio is defined as the driving strength ratio between the pull-up device over the respective pass-gate device. Specifically, the alpha ratio is defined as the ratio between the driving current of a pull-up device to the driving current of the respective pass-gate device, formulated as Ion (PU)/Ion (PG).

Figure 2:
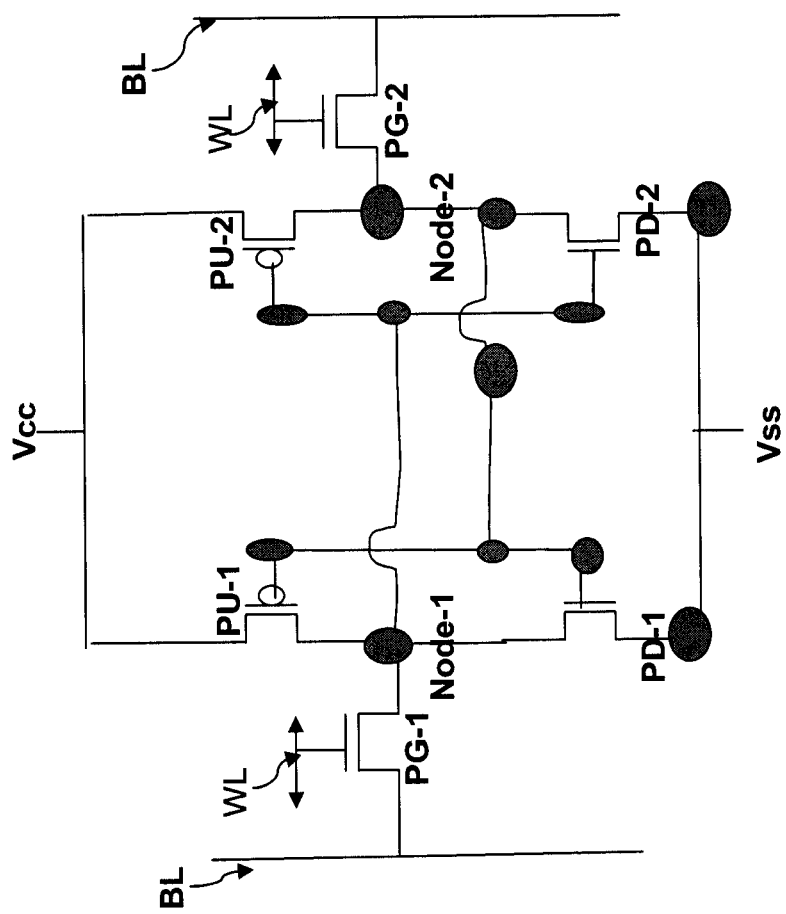
FIG. 2 is a schematic view of a static random access memory (SRAM) cell constructed according to various aspects of the present disclosure in one embodiment.

FIG. 2 is a schematic view of the first SRAM cell 14 constructed according to various aspects of the present disclosure in one embodiment. The SRAM cell 14 includes field-effect transistors (FETs), such as metal-oxide-semiconductor field effect transistors (MOSFETs). In the present embodiment, the SRAM cell 14 includes fin-like field-effect transistors (FinFETs). The SRAM cell 14 includes a first and second inverters that are cross-coupled as a data storage. The first inverter includes a first pull-up device formed with a p-type fin-like field-effect transistor (pFinFET), referred to as PU-1. The first inverter includes a first pull-down device formed with an n-type fin-like field-effect transistor (nFinFET), referred to as PD-1. The drains of the PU-1 and PD-1 are electrically connected together, forming a first data node ("Node 1"). The gates of PU-1 and PD-1 are electrically connected together. The source of PU-1 is electrically connected to a power line Vcc. The source of PD-1 is electrically connected to a complimentary power line Vss. The second inverter includes a second pull-up device formed with a pFinFET, referred to as PU-2. The second inverter also includes a second pull-down device formed with an nFinFET, referred to as PD-2. The drains of the PU-2 and PD-2 are electrically connected together, forming a second data node ("Node-2). The gates of PU-2 and PD-2 are electrically connected together. The source of PU-2 is electrically connected to the power line Vcc. The source of PD-2 is electrically connected to the complimentary power line Vss. Furthermore, the first data node is electrically connected to the gates of PU-2 and PD-2, and the second data node is electrically connected to the gates of PU-1 and PD-1. Therefore, the first and second inverters are cross-coupled as illustrated in FIG. 2.

The SRAM cell 14 further includes a first pass-gate device formed with an nFinFET, referred to as PG-1, and a second pass-gate device formed with another nFinFET, referred to as PG-2. The source of the first pass-gate PG-1 is electrically connected to the first data node and the source of the first pass-gate PG-2 is electrically connected to the second data node, forming ports for data access. Furthermore, the drain of PG-1 is electrically connected to a bit line ("BL"), and the gate of PG-1 is electrically connected to a word line ("WL"). Similarly, the drain of PG-2 is electrically connected to a complimentary bit line or the bit line BL, and the gate of PG-2 is electrically connected to the word line WL.

In one embodiment, the various nFinFETs and pFinFETs are formed using high-k metal gate technology so that the gate stacks includes a high-k dielectric material layer for gate dielectric and one or more metals for gate electrode. The finFETs are used to have three dimensional active regions such that the gate stacks are coupled with the respective channel regions over various surfaces of the fin-like active regions.

Referring back to FIG. 1, the second SRAM cell 16 is different from the first SRAM cell 14 by using a greater number of transistors. Particularly, the second SRAM cell 16 includes two pull-up devices and two pull-down devices configured to form two cross-coupled inverters for data storage and further includes two pass-gate devices coupled with the two pull-up devices and the two pull-down devices for data access. Each of the pull-up devices in the second SRAM cell 16 includes only one pFinFET. Each of the pull-down devices and pass-gate devices in the second SRAM cell 16 includes two or more n-type fin field-effect transistors (nFinFETs).

As such, the first SRAM cell 14 has a small cell size to achieve a high packing density and the second SRAM cell 16 has a large cell size to achieve a high operation current, such as high write current for write margin.

Figure 3:
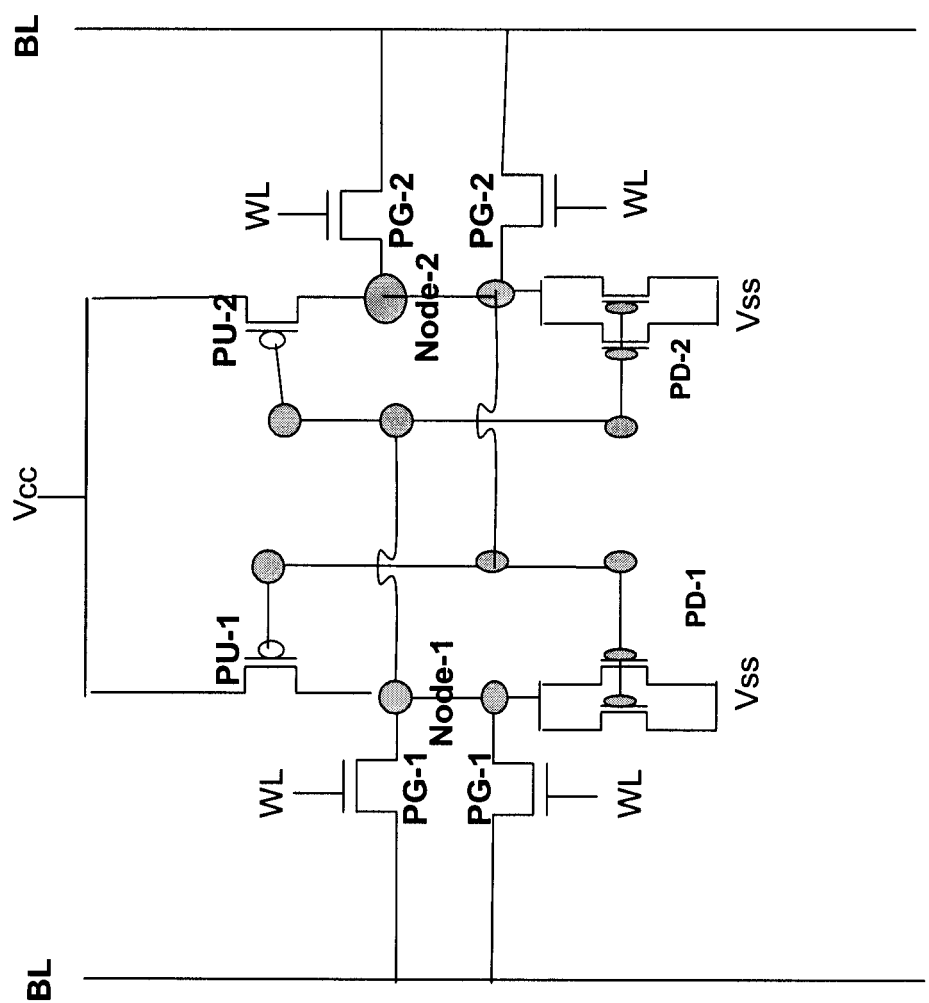
FIG. 3 is a schematic view of a SRAM cell constructed according to various aspects of the present disclosure in another embodiment.

FIG. 3 is a schematic view of the second SRAM cell 16 constructed according to aspects of the present disclosure in one embodiment. The SRAM cell 16 includes FinFETs in the present embodiment. The SRAM cell 16 includes a first and second inverters that are cross-coupled as a data storage. The first inverter includes a first pull-up device formed with only one pFinFET, referred to as PU-1. The first inverter includes a first pull-down device formed with two or more nFinFETs. This pull-down device is still referred to as PD-1. The drains of the PU-1 and PD-1 are electrically connected together, forming a first data node ("Node 1"). The gates of PU-1 and PD-1 are electrically connected together. The source of PU-1 is electrically connected to a power line Vcc. The source of PD-1 is electrically connected to a complimentary power line Vss. The second inverter includes a second pull-up device formed with one pFinFET, referred to as PU-2. The second inverter also includes a second pull-down device formed with two or more nFinFETs, referred to as PD-2. The drains of the PU-2 and PD-2 are electrically connected together, forming a second data node ("Node-2). The gates of PU-2 and PD-2 are electrically connected together. The source of PU-2 is electrically connected to the power line Vcc. The source of PD-2 is electrically connected to the complimentary power line Vss. Furthermore, the first data node is electrically connected to the gates of PU-2 and PD-2, and the second data node is electrically connected to the gates of PU-1 and PD-1. Therefore, the first and second inverters are cross-coupled.

The SRAM cell 16 further includes a first pass-gate device formed with two or more nFinFETs, referred to as PG-1, and a second pass-gate device formed with two or more nFinFETs, referred to as PG-2. The source of the first pass-gate PG-1 is electrically connected to the first data node and the source of the first pass-gate PG-2 is electrically connected to the second data node, forming ports for data access. Furthermore, the drain of PG-1 is electrically connected to a bit line ("BL"), and the gate of PG-1 is electrically connected to a word line ("WL"). Similarly, the drain of PG-2 is electrically connected to a complimentary bit line or the bit line BL, and the gate of PG-2 is electrically connected to the word line WL.

Referring back to FIG. 1, the integrated circuit 10 further includes a write assist circuitry 18 coupled with the first SRAM cell 14 in one embodiment. The write-assist circuitry 18 is designed operable to dynamically provide a dual-level voltage (a higher level voltage and a lower level voltage) to the sources of the corresponding pull-up devices in the first SRAM cell 14. The write-assist circuitry 18 is designed to provide one of the higher and lower voltages to the source of the pull-up devices according to operation status of the first SRAM cell 14. Particularly, during SRAM read operation, the higher level voltage is applied to the sources of the pull-up devices 14. During SRAM write operation, the lower level voltage is applied to the sources of the pull-up devices 14. The write-assist circuitry 18 is also referred to as voltage control circuitry. Any circuit known in the art with above functionality may be used and be included in the integrated circuit 10.

In one example, the write-assist circuitry 18 is connected to two power lines of respective voltage levels. The write-assist circuitry 18 is operable to select one of the voltage levels according to the operation modes, such as read or write. The write-assist circuitry 18 coupled to the first SRAM cell 14 provides read stability and write margin during the operations to the first SRAM cell.

In another embodiment, as the first SRAM cell 14 and the second SRAM cell 16 have different numbers of transistors, the respective transistors are further designed and/or fabricated differently. The nFinFETs in the first SRAM cell 14 have a first threshold voltage V1 and the nFinFETs in the second SRAM cell 16 have a second threshold voltage V2. In one example, the nFinFETs in the first SRAM cell 14 and the nFinFETs in the second SRAM cell 16 are fabricated differently such that V1 is different from V2. In one particular example, the first threshold voltage V1 is less than the second threshold voltage V2.

In furtherance of the embodiment, the nFinFETs in the first SRAM cell 14 are fabricated by a first device formation process and the nFinFETs in the second SRAM cell 16 are formed by a second device formation process that is different from the first device formation process. Accordingly, the nFinFETs in the first SRAM cell 14 and the nFinFETs in the second SRAM cell 16 are different in at least one of composition, formation and dimension.

The nFinFETs in the first SRAM cell 14 include first gate stacks and the nFinFETs in the second SRAM cell 16 include second gate stacks. In one embodiment, the first gate stacks are different from the second gate stacks. In various examples, the first gate stacks and the second gate stacks are different in at least one of gate dielectric material, gate dielectric thickness and gate electrode material.

In other examples, the nFinFETs in the first SRAM cell 14 and the nFinFETs in the second SRAM cell 16 are different in at least one of p-well doping concentration, p-well dimension, and channel doping concentration. In yet other examples, the nFinFETs in the first SRAM cell 14 and the nFinFETs in the second SRAM cell 16 are different in at least one of pocket doping features and n-type light-doped drain (NLDD) features.

Figure 4:
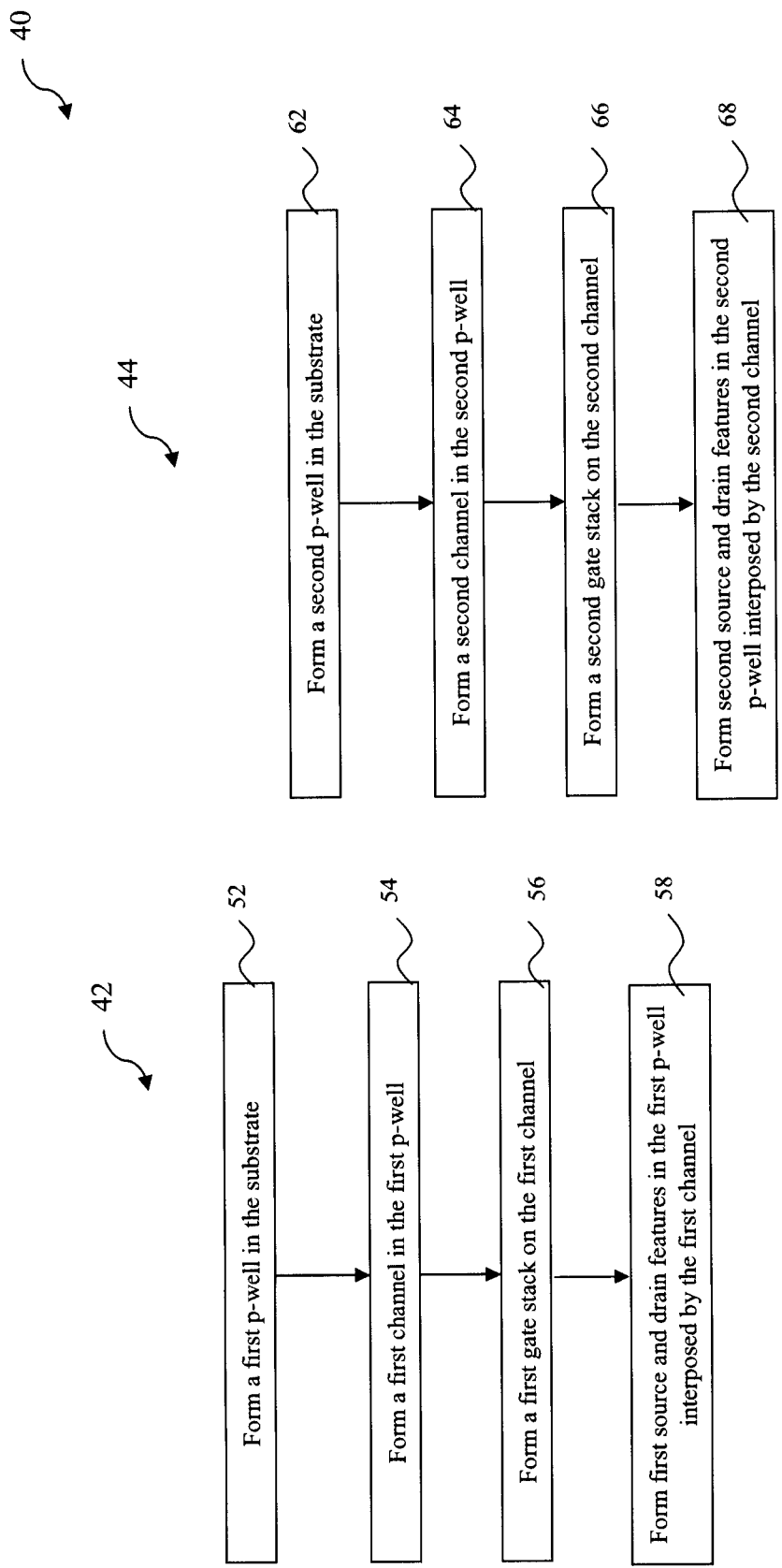
FIG. 4 is a flowchart of a method making the integrated circuit of FIG. 2 according to one embodiment.
Figure 5:
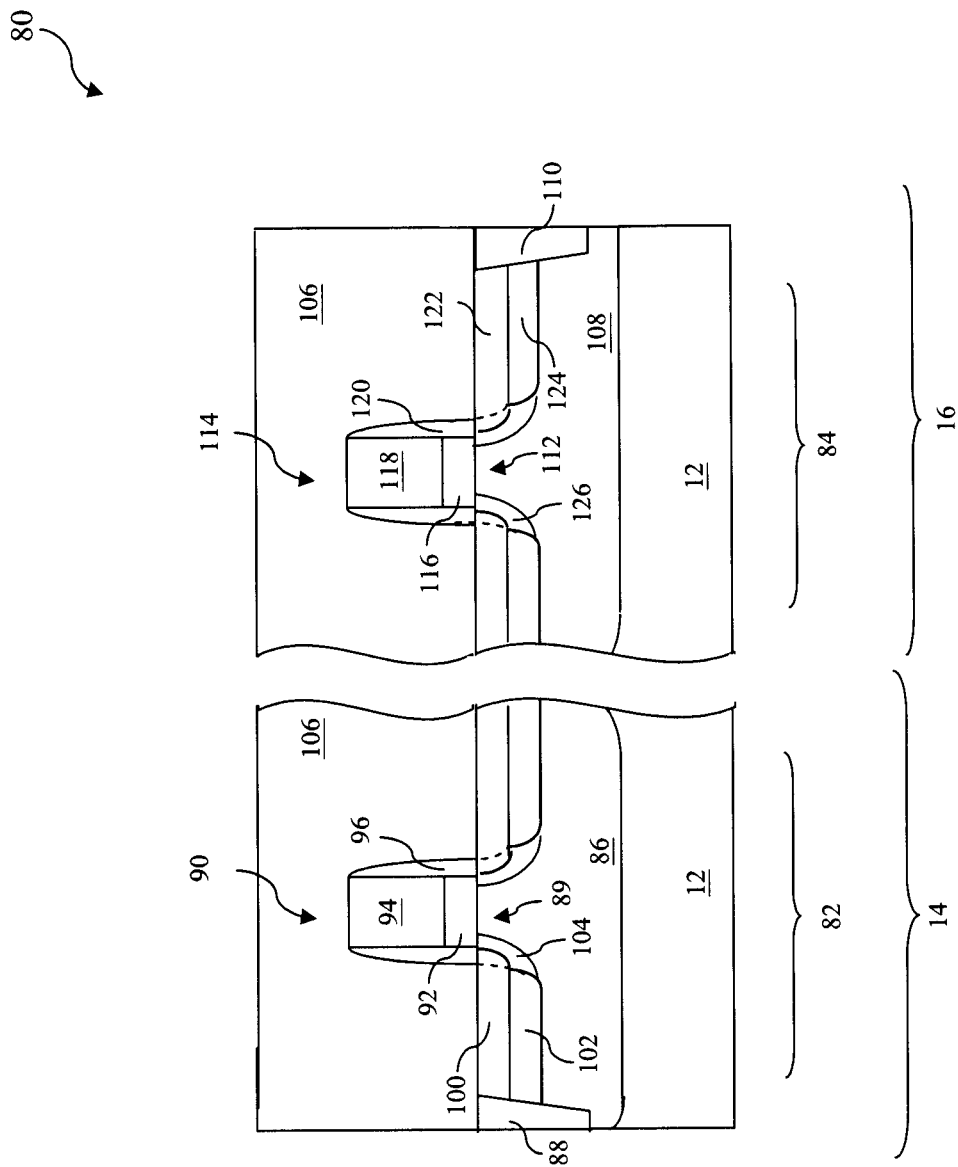
FIG. 5 is a sectional view of a portion of the integrated circuit made by the method of FIG. 4 constructed according to various aspects of the present disclosure in various embodiments.

FIG. 4 is a flowchart of a method 40 to form an integrated circuit having two SRAM cells with different cell sizes. FIG. 5 is a fragmentary sectional view of an integrated circuit 80 formed by the method 40. In the present embodiment, the integrated circuit 80 is the integrated circuit 10 of FIG. 1 and includes the first SRAM cell 14 and the second SRAM cell 16. The method 40 and the integrated circuit 80 are described below with reference to FIGS. 4 and 5.

Referring to FIG. 5, the integrated circuit 80 includes a first SRAM cell 14 and a second SRAM cell 16 formed in a substrate 12. In the present embodiment, each of the pull-down device and pass-gate devices in the first SRAM cell 14 includes only one first nFinFET 82 while each of the pull-down device and pass-gate devices in the second SRAM cell 16 includes at least two second nFinFETs 84. FIG. 5 only illustrates one of the first nFinFET 82 and one of the second nFinFET 84. The first nFinFET 82 and the second nFinFET 84 are different form each other and are formed by respective processes according to one embodiment.

The first nFinFET 82 includes a first p-well 86 formed in the substrate 12 and may be isolated from other devices by isolation features, such as shallow trench isolation (STI) features 88. A first channel 89 for the first nFinFET 82 is formed in the first p-well. The first channel 89 includes p-type dopants but may has a doping concentration different from that of the first p-well 86.

The first nFinFET 82 includes a first gate stack 90 disposed on the first channel 89. The first gate stack 90 includes a first gate dielectric feature 92 and a first gate electrode 94 disposed on the first gate dielectric feature 92. The first gate stack 90 may further include first gate spacers 96 disposed on sidewalls of the first gate dielectric feature 92 and the first gate electrode 94. The first gate dielectric feature 92 includes a first gate dielectric material, such as silicon oxide or a suitable dielectric material having a higher dielectric constant (high-k dielectric material). In one embodiment, the first gate dielectric feature 92 includes more than one dielectric material layers. For example, the first gate dielectric feature 92 includes an interfacial dielectric layer, such as silicon oxide, and a high-k dielectric material layer on the interfacial layer. The first gate electrode 94 includes a conductive material layer, such as doped polysilicon, metal, metal alloy, and/or metal silicide. In one embodiment, the first gate electrode 94 includes more than one conductive material layers. For example, the first gate electrode 94 includes a first conductive layer having a suitable work function on the first gate dielectric feature 92 and a second conductive layer on the first conductive layer. In one example, the first conductive layer includes tantalum or titanium aluminum. In another example, the second conductive layer includes aluminum, tungsten, copper, doped polysilicon or combinations thereof. The gate spacers 96 include a dielectric material, such as silicon oxide, silicon carbide, silicon nitride or silicon oxynitride.

The first nFinFET 82 further includes first source and drain features of n-type dopants. The first source and drain features are formed in the first n-well 86 and is interposed by the first channel 89. In one embodiment, the first source and drain features include n-type light doped drain (NLDD) features 100 and heavily doped source and drain (S/D) features 102.

In another embodiment, the first nFinFET 82 further includes a first pocket implantation feature 104 formed in the first n-well 86 and is interposed between the first channel 89 and the first source and drain features (such as S/D features 102). In furtherance of the embodiment, the first pocket implantation feature 104 includes p-type dopants but has a doping concentration greater than that of the first channel 89.

Disposed on the substrate 12 is a dielectric material layer 106, such as an interlayer dielectric (ILD) material. In various embodiments, the dielectric material layer 106 includes silicon oxide, a fluorinated silicon oxide or a suitable dielectric material having a lower dielectric constant (low-k dielectric material).

The second nFinFET 84 includes a second p-well 108 formed in the substrate 12 and may be isolated from other devices by isolation features, such as STI features 110. A second channel 112 for the second nFinFET 84 is formed in the second p-well 108. The second channel 112 includes p-type dopants but may has a doping concentration different from that of the second p-well 108.

The second nFinFET 84 includes a second gate stack 114 disposed on the second channel 112. The second gate stack 114 includes a second gate dielectric feature 116 and a second gate electrode 118 disposed on the second gate dielectric feature 116. The second gate stack 114 may further include second gate spacers 120 disposed on sidewalls of the second gate dielectric feature 116 and the second gate electrode 118. The second gate dielectric feature 116 includes a second gate dielectric material, such as silicon oxide or a high-k dielectric material. In one embodiment, the second gate dielectric feature 116 includes more than one dielectric material layers. For example, the second gate dielectric feature 116 includes an interfacial dielectric layer and a high-k dielectric material layer formed on the interfacial layer. The second gate electrode 118 includes a conductive material layer, such as doped polysilicon, metal, metal alloy, and/or metal silicide. In one embodiment, the second gate electrode 118 includes more than one conductive material layers. For example, the second gate electrode 118 includes a first conductive layer having a suitable work function on the second gate dielectric feature 116 and a second conductive layer on the respective first conductive layer of the second gate stack 114. In one example, the first conductive layer includes tantalum or titanium aluminum. In another example, the second conductive layer includes aluminum, tungsten, copper, doped polysilicon or combinations thereof. The second gate spacers 120 include a dielectric material, such as silicon oxide, silicon carbide, silicon nitride or silicon oxynitride.

The second nFinFET 84 further includes second source and drain features of n-type dopants. The second source and drain features are formed in the second n-well 108 and is interposed by the second channel 112. In one embodiment, the second source and drain features include NLDD features 122 and heavily doped source and drain (S/D) features 124.

In another embodiment, the second nFinFET 84 further includes a second pocket implantation feature 126 formed in the second n-well 108 and is interposed between the second channel 112 and the second source and drain features (such as S/D features 124). In furtherance of the embodiment, the second pocket implantation feature 126 includes p-type dopants but has a doping concentration greater than that of the second channel 112.

The dielectric material layer 106 is also disposed on the substrate 12 in the region of the second nFinFET 84.

However, according to the present embodiment, the first nFinFET 82 and the second nFinFET 84 are different from each other. In one example, the first nFinFET 82 and the second nFinFET 84 are designed and formed with different threshold voltages.

In the present embodiment, the first nFinFET 82 and the second nFinFET 84 are formed differently in at least one of composition, formation and dimension.

Referring to FIG. 4, the method 40 includes a first device formation process 42 to form the first SRAM cell 14 and a second device formation process 44 to form the second SRAM cell 16. In furtherance of the embodiment, the first nFinFET 82 is fabricated by the first device formation process 42 and the second nFinFET 84 is fabricated by the second device formation process 44 that is different from the first device formation process 42. In one example, at least one step of the first device formation process is different from the respective step of the second device formation process.

The first device formation process 42 includes a step 52 by forming the first p-well 86 in the substrate 12 using a first p-well lithography process and a first p-well ion implantation. In one example, the first p-well lithography process defines the first p-well 86 with a first p-well dimension. In another example, the first p-well ion implantation includes a first p-well doping dose to form the first p-well with a first p-well concentration.

The first device formation process 42 further includes a step 54 to form the first channel 89 in the first p-well 86 using a first channel implantation, resulting in the first channel 89 with a first channel doping profile and a first channel doping concentration. In one embodiment, the first channel implantation includes a first channel doping dose designed to tune the threshold voltage of the first channel 89. In another embodiment, the first channel implantation includes various implantations designed to form the first channel doping profile.

In another embodiment, the device formation process 42 further includes a step 56 to form the first gate stack 90 on the first channel 89. In one embodiment, the formation of the first gate stack 90 may utilize a gate stack with high-k dielectric for gate dielectric and metal for gate electrode. In another embodiment, the formation of the first gate stack 90 may includes a gate-last process, or a high k-last process, a gate-first process, or a combination thereof. In the gate-last process, a dummy gate stack is formed on the substrate by depositions, lithography patterning and etching; an ILD material layer is formed on the substrate by deposition and polishing; the dummy gate stack is partially removed; and then a metal gate electrode is formed by deposition and polishing, according to one example. In the high k-last process, a dummy gate stack is formed on the substrate by depositions, lithography patterning and etching; an ILD material layer is formed on the substrate by deposition and polishing; the dummy gate stack is removed; and then a high k dielectric material and metal gate electrode are formed by depositions and polishing, according to another example. In the gate-first process, a gate stack of a high k dielectric material and a metal electrode is formed on the substrate by depositions, lithography patterning and etching; source and drain features are formed by various ion implantations; and an ILD material layer is formed on the substrate by deposition and polishing, such chemical mechanical polishing (CMP).

The first device formation process 42 also includes a step 58 to form the various source and drain features, such as the NLDD features 100 and the S/D features 102, using respective first source and drain doping dose. In another embodiment, the first device formation process 42 further includes a first pocket implantation to form a pocket implantation features 104 at the edges of the first channel 89. The first pocket implantation implements a first pocket implantation dose.

Similarly, the second device formation process 44 includes a step 62 by forming the second p-well 108 in the substrate 12 using a second p-well lithography process and a second p-well ion implantation. In one example, the second p-well lithography process defines the second p-well 108 with a second p-well dimension. In another example, the second p-well ion implantation includes a second p-well doping dose to form the second p-well with a second p-well concentration.

The second device formation process 44 further includes a step 64 to form the second channel 112 in the second p-well 108 using a second channel implantation, resulting in the second channel 112 with a second channel doping profile and a second channel doping concentration. In one embodiment, the second channel implantation includes a second channel doping dose designed to tune the threshold voltage of the second channel 112. In another embodiment, the second channel implantation includes various implantations designed to form the second channel doping profile.

In another embodiment, the device formation process 44 further includes a step 66 to form the second gate stack 114 on the second channel 112. In one embodiment, the formation of the second gate stack 114 may utilize a gate stack with high-k dielectric for gate dielectric and metal for gate electrode. In another embodiment, the formation of the second gate stack 114 may includes a gate-last process, or a high k-last process, a gate-first process, or a combination thereof.

The second device formation process 44 also includes a step 68 to form the various source and drain features, such as the NLDD features 122 and the S/D features 124, using respective second source and drain doping dose. In another embodiment, the second device formation process 44 further includes a second pocket implantation to form a pocket implantation features 126 at the edges of the second channel 112. The second pocket implantation implements a second pocket implantation dose.

In the present embodiment, the first device formation process 42 and the second device formation process 44 are different from each other in at least one step in terms of composition and formation. For example, the respective materials may be different, such as the metal gate electrode materials being different. In another example, the formation may be different, such as respective implantation doses being different. When other steps of the first and device formation processes are same, those respective steps for the first nFinFET 82 and the second nFinFET 84 are implemented simultaneously. For example, the ILD layer 106 may be formed simultaneously for both first nFinFET 82 and second nFinFET 84.

In another embodiment, the first SRAM cell 14 includes a first pFinFET and the second SRAM cell 16 includes a second pFinFET, such as those pFinFETs in the integrated circuit 10 of FIG. 2. Accordingly, the first device formation process 42 includes various steps to form the first pFinFET and the second device formation process 44 includes various steps to form the second pFinFET. Particularly, the first device formation process 42 includes a first p_Vt process applied to the first pFinFET to tune the respective threshold voltage and the second device formation process 44 includes a second p_Vt process applied to the second pFinFET to tune the respective threshold voltage. The first p_Vt process and the second p_Vt process are different from each other.

FIG. 6 is a schematic view of a SRAM structure 130 constructed according to aspects of the present disclosure in one embodiment. The SRAM structure 130 includes various SRAM cells formed on the substrate 12. In the present embodiment, the SRAM structure 130 includes a first SRAM cell 132 and a second SRAM cell 134 formed on the substrate 12. The SRAM cells in the SRAM structure 130 are single port SRAMs. The labels in FIG. 6 are similar to the labels in FIGS. 2 and 3. The complimentary bit line is labeled as bit line bar or "BLB".

The SRAM structure 130 is one embodiment of the integrated circuit 10 in FIG. 1. In furtherance of the embodiment, the first SRAM cell 132 is the first SRAM cell 14 of the integrated circuit 10 and the second SRAM cell 132 is the second SRAM cell 16 of the integrated circuit 10.

The first SRAM cell 132 includes various pull-up devices of pFinFETs 136. The first SRAM cell 132 further includes various pass-gate devices and pull-down devices of nFinFETs 138. Similarly, the second SRAM cell 134 includes various pull-up devices of pFinFETs 142. The second SRAM cell 134 further includes various pass-gate devices and pull-down devices of nFinFETs 144.

In one example, the SRAM structure 130 is the integrated circuit 10 of FIG. 2. In another example, the pass-gate devices and pull-down devices of the first SRAM cell 132 each include a single nFinFET. In furtherance of this example, the pass-gate devices and pull-down devices of the second SRAM cell 132 each include at least two nFinFET.

The pFinFETs 136 are formed by a first p_Vt process designed to tune the threshold voltage of the respective pFinFETs 136 and the nFinFETs 138 are formed by a first n_Vt process designed to tune the threshold voltage of the respective nFinFETs 138. The pFinFETs 142 are formed by a second p_Vt process designed to tune the threshold voltage of the respective pFinFETs 142 and the nFinFETs 144 are formed by a second n_Vt process designed to tune the threshold voltage of the respective nFinFETs 144.

In the present embodiment, at least one of the first p_Vt process and the first n_Vt process is different from the respective one of the second p_Vt process and the second n_Vt process, in term of doping dose.

Figure 7:
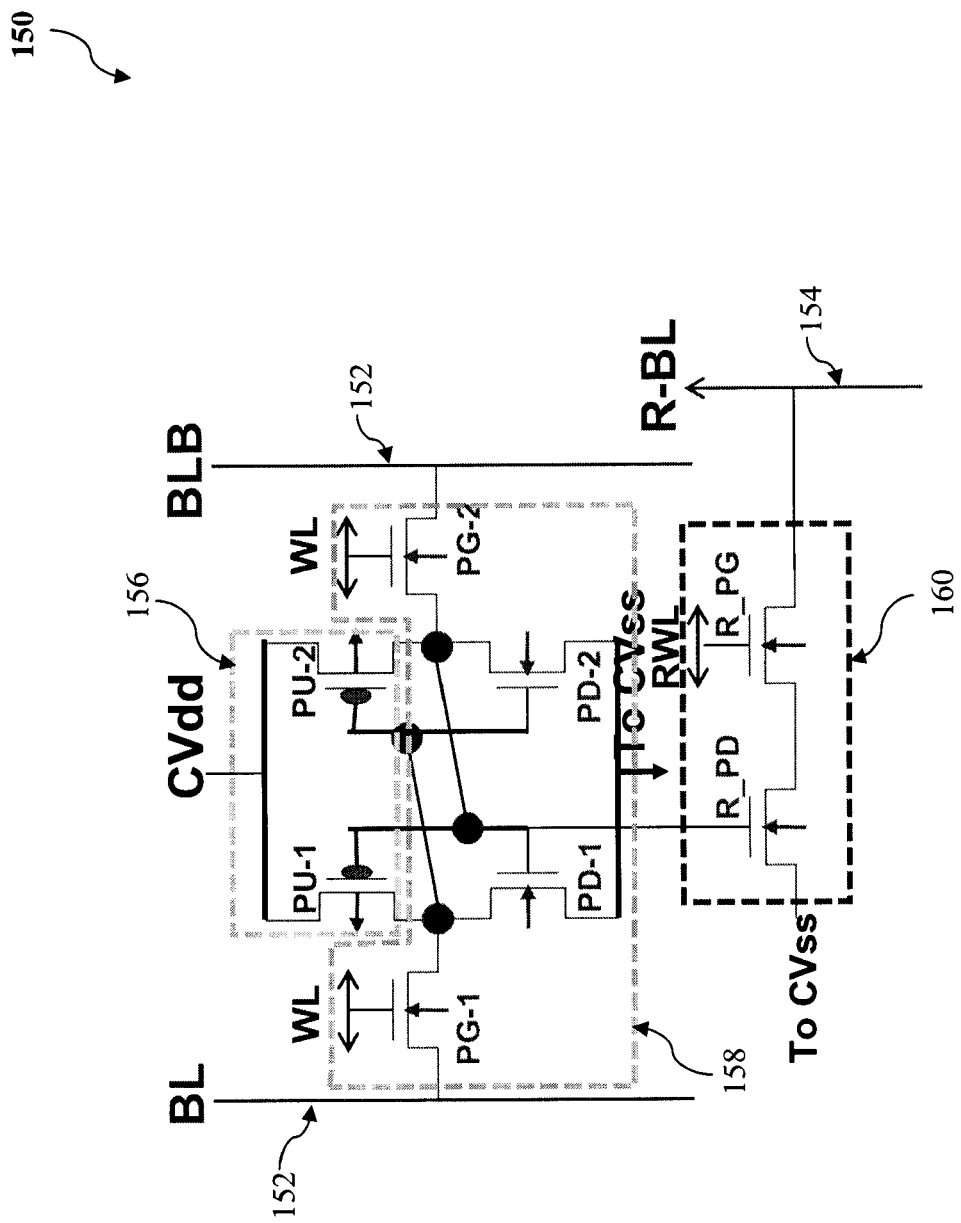
FIG. 7 is a schematic view of a SRAM cell constructed according to various aspects of the present disclosure in another embodiment.

FIG. 7 is a schematic view of a SRAM cell 150 constructed according to aspects of the present disclosure in one embodiment. The SRAM cell 150 is one embodiment of the second SRAM cell 16 of the integrated circuit 10 in FIG. 1. In furtherance of the embodiment, the SRAM cell 132 in FIG. 6 is the first SRAM cell 14 of the integrated circuit 10. In addition to FIG. 7, the following description also refers to FIG. 6 and the corresponding description.

The SRAM cell 150 is a two-port SRAM cell. The SRAM cell 150 includes a write port 152 and a read port 154. Particularly, the SRAM cell 150 includes various pull-up devices of pFinFETs 156. The SRAM cell 150 further includes various pass-gate devices and pull-down devices of nFinFETs 158. The pass-gate devices of nFinFETs 158 are configured to form the write port 152. Furthermore, the SRAM cell 150 includes one or more pull-down devices (labeled as R_PD) and pass-gate devices (labeled as R_PG) of nFinFETs 160 configured to form the read port 154. In one embodiment, the nFinFETs 160 are further connected to a word line for read (labeled as "RWL").

Referring to FIGS. 6 and 7, the pFinFETs 156 are formed by the second p_Vt process designed to tune the threshold voltage of the respective pFinFETs 156. The nFinFETs 158 are formed by the second n_Vt process designed to tune the threshold voltage of the respective nFinFETs 158. The nFinFETs 160 are formed by a third n_Vt process designed to tune the threshold voltage of the respective nFinFETs 160.

In one embodiment, the first p_Vt process is different from the second p_Vt process. In another embodiment, the first n_Vt process, the second n_Vt process and the third n_Vt process is different from the rest one of the first n_Vt process, the second n_Vt process and the third n_Vt process.

Figure 8:
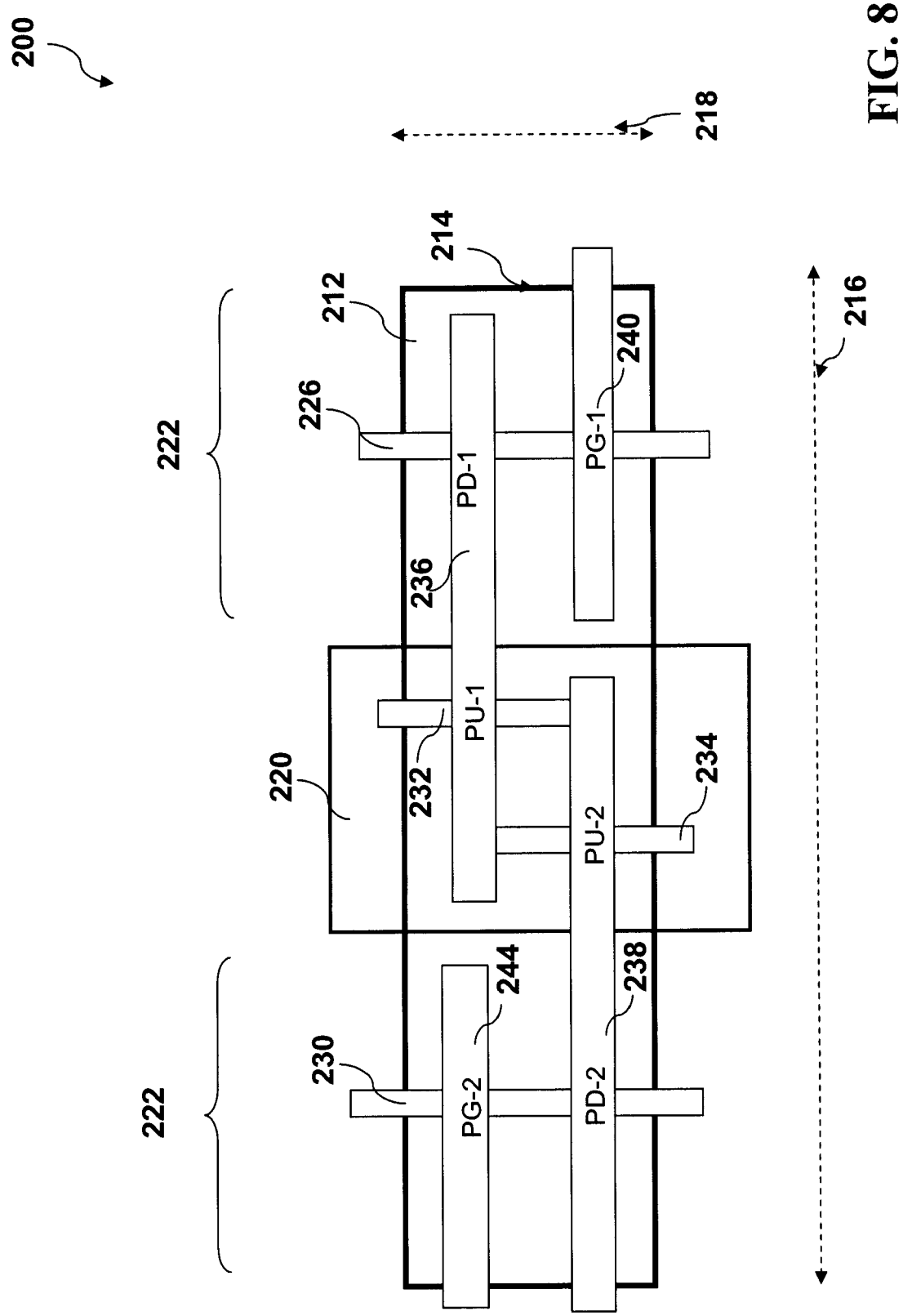
FIGS. 8 and 9 are top views of a SRAM device constructed according to various aspects of the present disclosure in one embodiment.
Figure 9:
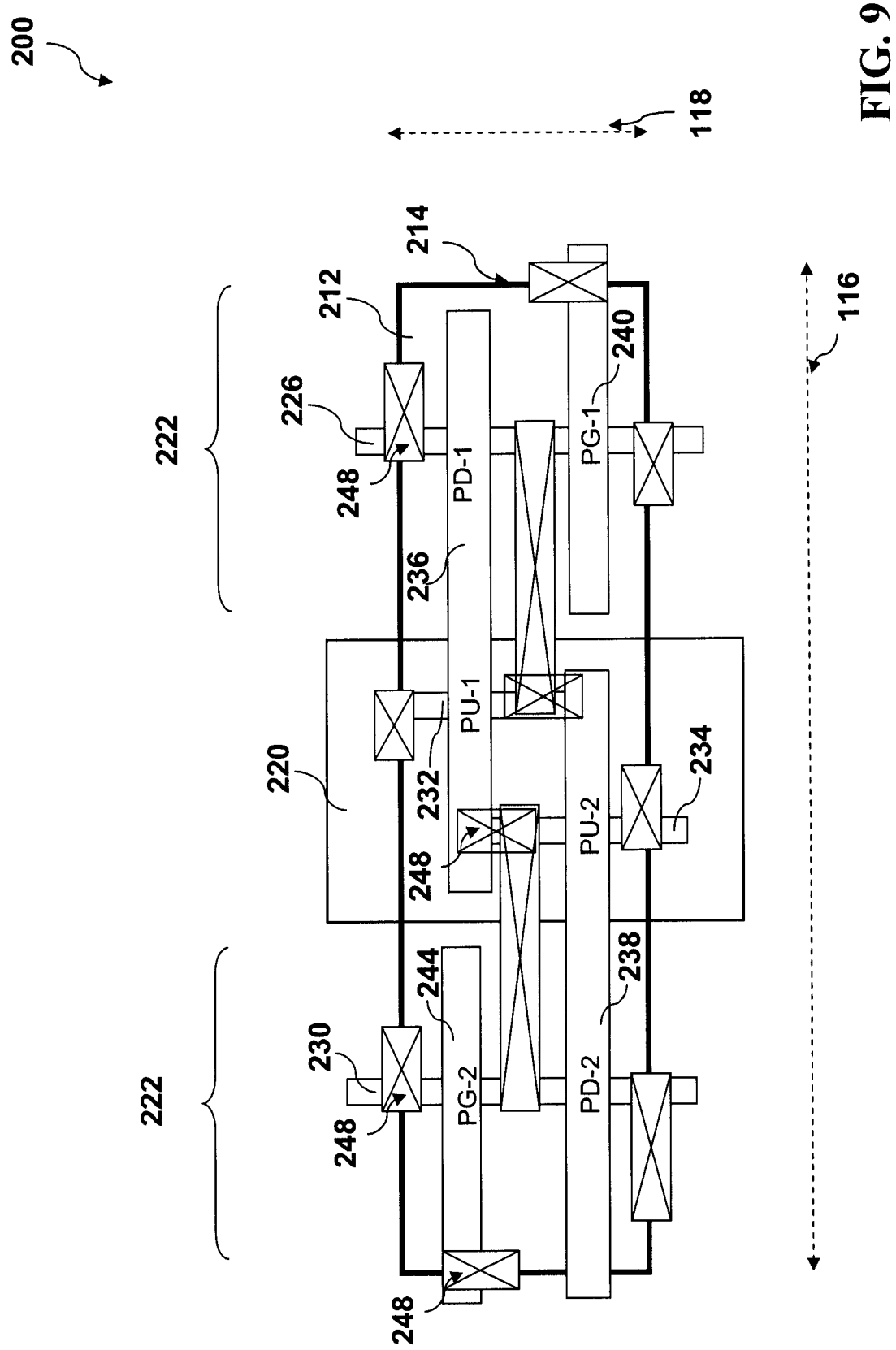

FIGS. 8 to 9 are top views of a SRAM cell 200 constructed according to various aspects of the present disclosure in one or more embodiments. The SRAM cell 200 and a method of making the same are collectively described with reference to FIGS. 8 through 9. In one embodiment, the SRAM cell 200 is the SRAM cell 14 of FIG. 1 or the SRAM cell 14 of FIG. 2. The SRAM cell 200 is formed on a semiconductor substrate and include various FinFETs.

The SRAM cell 200 is formed in a unit cell region 212 of the semiconductor substrate. The unit cell region 212 is defined by the unit cell boundary 214. In one embodiment, the unit cell region 212 is defined in a rectangular shape spanning to a first dimension 216 in a first direction and spanning to a second dimension 218 in a second direction perpendicular to the first direction. The first dimension 216 is longer than the second dimension 218. So the first and second dimensions (216 and 218) are referred to as a longer pitch and a shorter pitch, respectively. Furthermore, two perpendicular directions are defined accordingly and are referred to as a first direction 216 and a second direction 218. The SRAM cell 200 includes a N-well (region) 220 disposed in the central portion of the cell. The SRAM cell 200 further includes a P-well (region) 222 disposed on the both sides of the N-well 220. In one embodiment, the N-Well 220 and P-well 222 are extended to multiple cells beyond the unit cell boundary.

Various fin active regions are defined in the substrate by isolation features and are isolated from each other by the isolation features. The isolation features are formed in the substrate with a proper technology. For example, the isolation features are utilized by STI. In one embodiment, the SRAM cell 200 includes a first active region 226 and a second active region 230 formed in the P-well 222. The SRAM cell 200 further includes a third active region 232 and a fourth active region 234 formed in the N-well 220. The first to fourth active regions are disposed along the second dimension and may be extended to multiple cells. In one embodiment, the first and the second active regions are extended to 4 or more cells in the second direction 218. In the present embodiment, each active region in the P-well 222 includes a pull-down device and a pass-gate device.

In one embodiment, the first active region 226 includes the first pull-down device (PD-1) and the first pass-gate device (PG-1) that are cascaded. The source of PG-1 is electrically connected to the drain of the PD-1. Particularly, PD-1 is disposed in a first portion of the first active region 226 while PG-1 is disposed in a second portion of the first active region 226. Similarly, the second active region 230 includes the second pull-down device (PD-2) and the second pass-gate device (PG-2) that are cascaded. The source of PG-2 is electrically connected to the drain of the PD-2. Particularly, PG-2 is disposed in a first portion of the second active region 230 while PD-2 is disposed in a second portion of the second active region 230. The third active region 232 includes the first pull-up device (PU-1) and the fourth active region 234 includes the second pull-up device (PU-2).

Various gate features are formed within the SRAM cell 200 for various nFinFETs and pFinFETs. In one embodiment, the SRAM cell 200 includes a first gate feature 236 disposed in the cell region 212 and extended in the first direction over the first active region 226 and the third active region 232, forming the gates for PD-1 and PU-1. The SRAM cell 200 includes a second gate feature 238 disposed in the cell region 212 and extended in the first direction over the second active region 230 and the fourth active region 234, forming the gates for PD-2 and PU-2. The SRAM cell 200 includes other gate features for the pass-gate devices. In one embodiment, the SRAM cell 200 includes a gate feature 240 disposed over the first active region 226, forming the gate for PG-1. The cell 200 also includes a gate feature 244 disposed over the second active region 230, forming the gate for PG-2.

In one embodiment of the configuration as illustrated in FIG. 8, the first and the second active regions in the P-well 222 and the associated pull-down devices and pass-gate devices are symmetrically disposed on the two sides of the N-well 220. The pull-down devices and pass-gate devices are tuned to have different threshold voltages to address the issues, such as current crowding issue, discussed in the background. The pull-down devices (PD-1 and PD-2) are designed to have a first threshold voltage Vt1. The pass-gate devices (PG-1 and PG-2) are designed to have the first threshold voltage Vt1 as well in this example.

With further reference to FIG. 9, illustrated is a top view of the SRAM cell 200 including interconnect routings. Various interconnect structures may be utilized to couple the nFinFETs and pFinFETs to form the functional SRAM cell. In one embodiment, the drain of PD-1 is electrically connected to the source of PG-1 by sharing a common doped region, a region defined in the first active region 226 and positioned between the PD-1 and PG-1.

In another embodiment, the drain of PD-1 is electrically connected to the source of PG-1 by a silicide feature (not shown) formed on the common doped region within the first active region 226. The silicide feature is formed by a process known in the art such as self-aligned silicide (salicide) and can be formed together with other contact silicide in a same processing procedure. In another embodiment, a contact is designed to land on both the drain of PD-1 and the source of PG-1. In yet another embodiment, the drain of PD-1 and the source of PG-1 share a common region. Similarly, the drain of PD-2 and the source of PG-2 are electrically connected in a way similar to the connection between the drain of PD-1 and the source of PG-1, such as by a silicide feature.

The drains (drain node) of PD-1 and PU-1 are electrically connected using a first interconnect feature, defining a first data node (node 1 or data node). Similarly, the drains (drain node) of PD-2 and PU-2 are electrically connected using a second interconnect feature, defining a second data node (node 2 or data node bar). The first interconnect feature and the second interconnect feature are formed in a same interconnect layer (referred to as first interconnect layer) by a same processing procedure. The first and second interconnect features may be a silicide feature.

Various contacts 248 (illustrated as a rectangle with an "X") are formed on gates, drain nodes, and various landing pads. The various contacts are designed as a square or rectangle in a top view. For example, a contact is designed as a rectangle oriented in the second direction 218 such that the contact lands on both the first gate feature 236 and the drain of the PU-2. Similarly, another contact is designed as a rectangle oriented in the second direction 218 such that the contact lands on both the second gate feature 238 and the drain of the PU-1.

Figure 10:
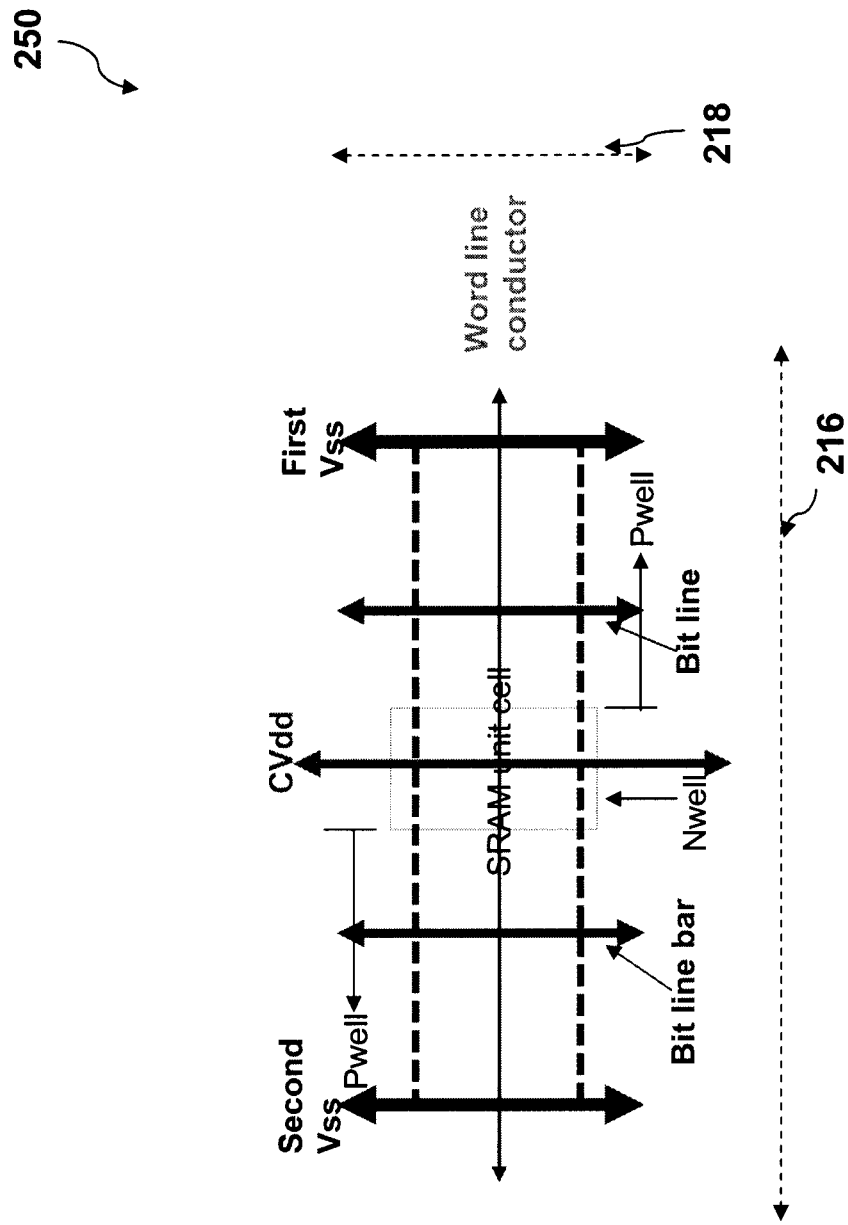
FIGS. 10 and 11 are schematic views of an interconnect structure constructed according to various aspects of the present disclosure in various embodiments.
Figure 11:
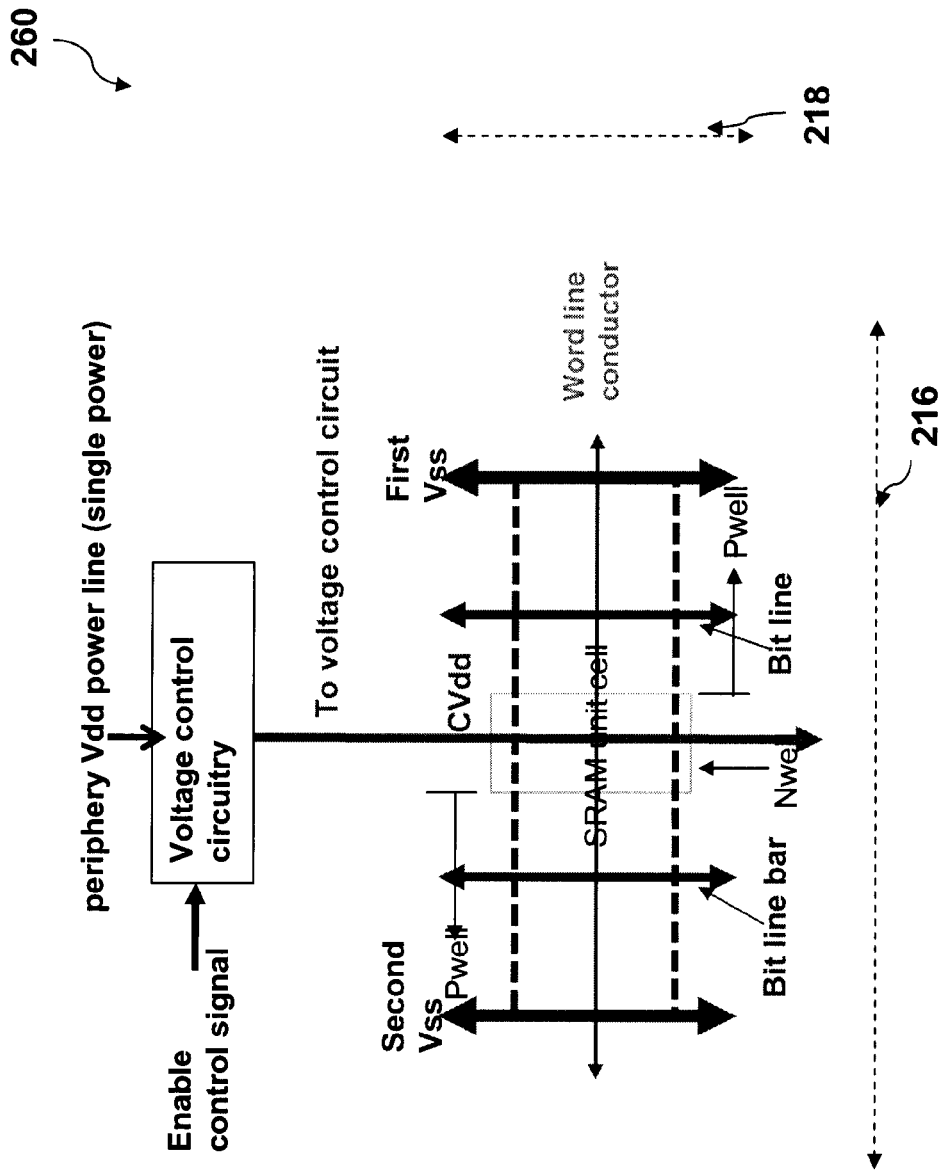

FIGS. 10 and 11 illustrate various interconnect features formed on and coupled with the SRAM cell 200. In one embodiment, various interconnect features associated with the SRAM cell 200 include various metal lines oriented in the second direction 218 and formed in a same metal layer as illustrated in FIG. 10. In one example as labeled in FIG. 10, one metal line is a power line for Vdd coupled to the source of the pull-up devices, one metal line is a bit line coupled to the drain of PU-2, and another metal line is a bit line coupled to the drain of PU-1. One metal line is connected to a power line (or complimentary power line) for first Vss and another metal line is connected to a power line for second Vss. The metal lines in this metal layer are coupled to the corresponding landing features through corresponding contacts 248.

In another embodiment illustrated in FIG. 11, the SRAM cell 200 includes a voltage control circuitry connected to the pull-up devices. Particularly, the voltage control circuitry is supplied by the periphery power line and is connected to the pull-up devices through one of metal lines, as illustrated in FIG. 11.

Figure 12:
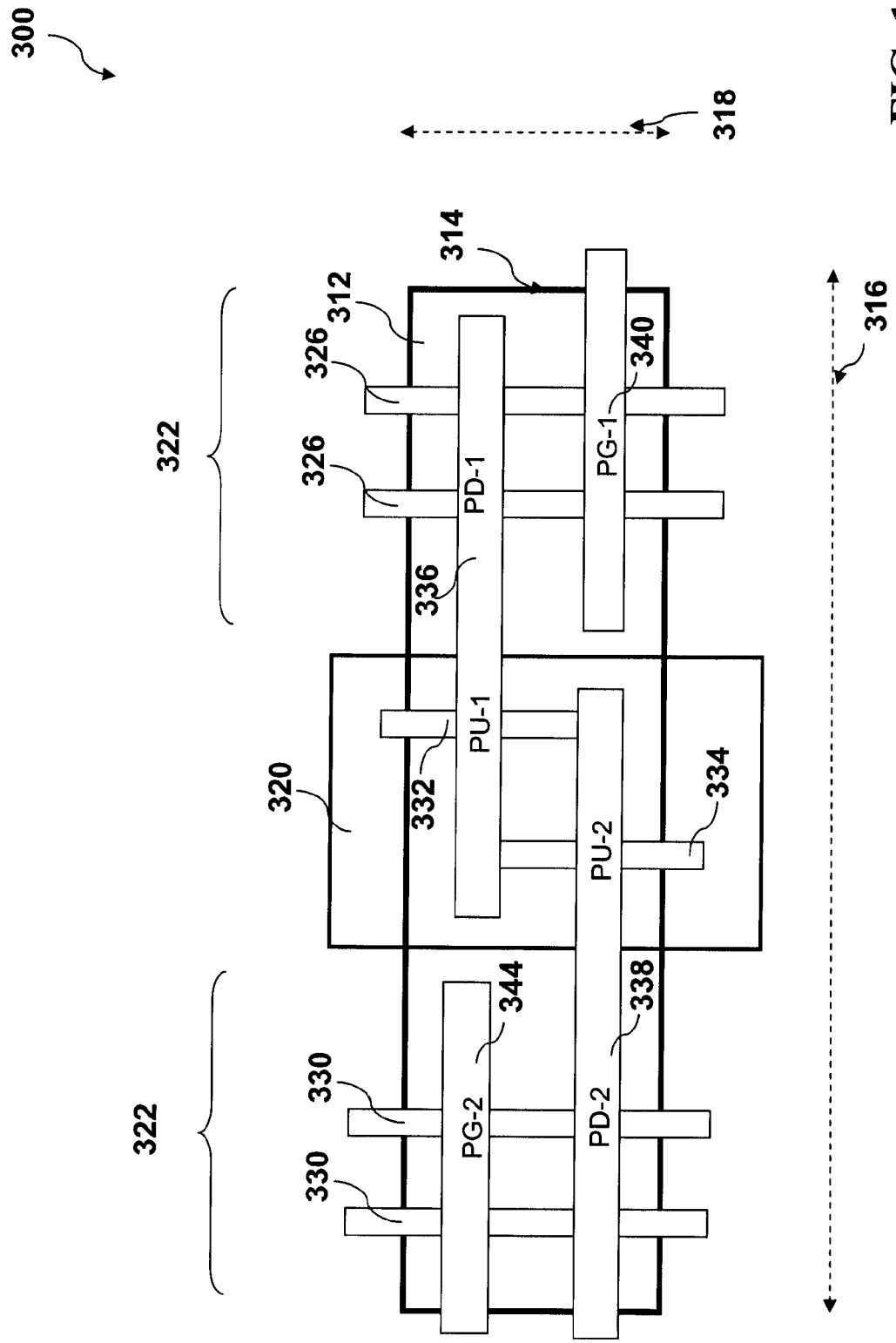
FIGS. 12 and 13 are top views of a SRAM device constructed according to various aspects of the present disclosure in another embodiment.
Figure 13:
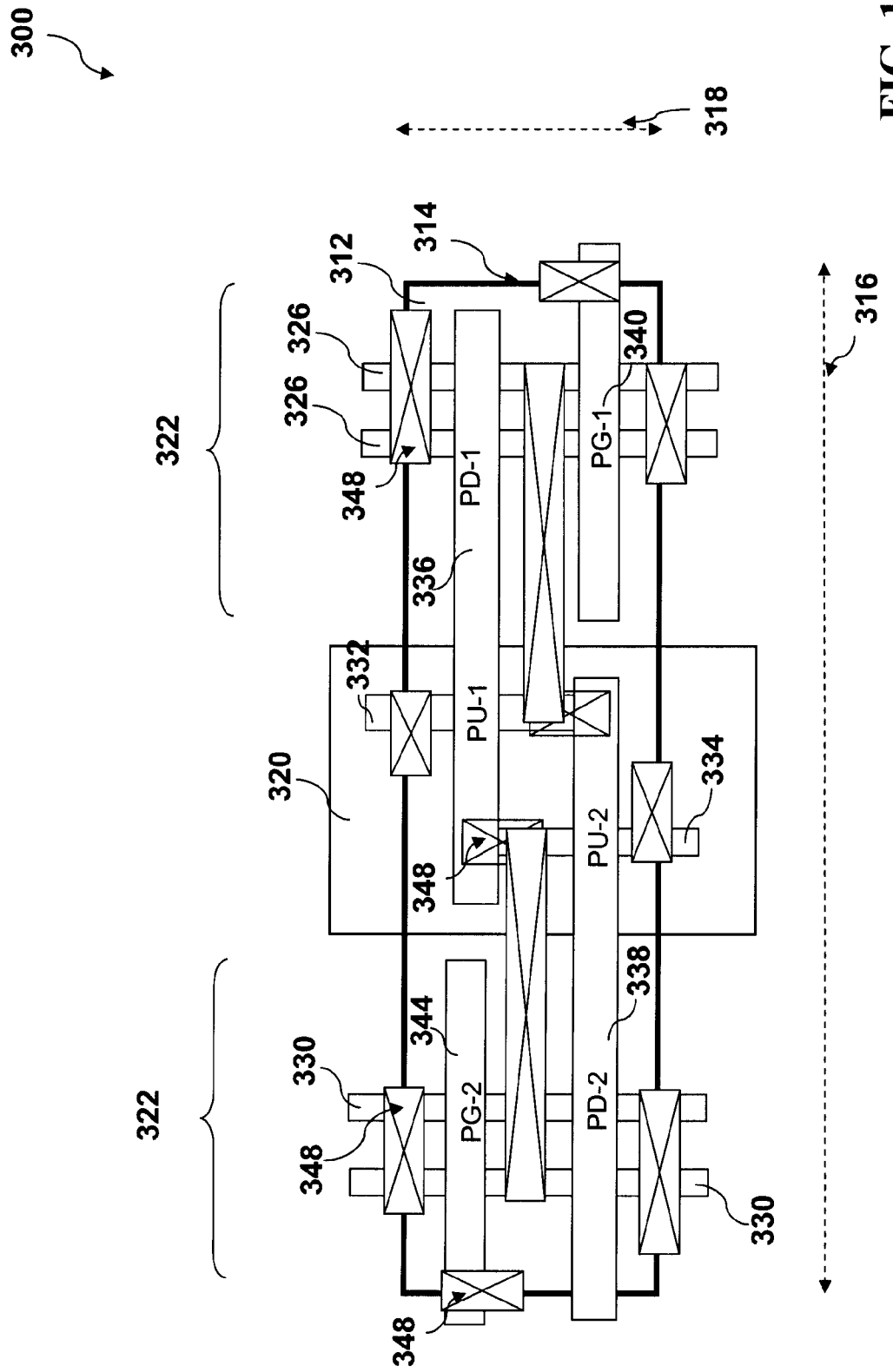

FIGS. 12 to 13 are top views of a SRAM cell 300 constructed according to various aspects of the present disclosure in one or more embodiments. The SRAM cell 300 and a method of making the same are collectively described with reference to FIGS. 12 through 13. In one embodiment, the SRAM cell 300 is the second SRAM cell 16 of FIG. 1 or the SRAM cell 16 of FIG. 3. The SRAM cell 300 is formed on a semiconductor substrate and include various FinFETs.

The SRAM cell 300 is formed in a unit cell region 312 of the semiconductor substrate. The unit cell region 312 is defined by the unit cell boundary 314. In one embodiment, the unit cell region 312 is defined in a rectangular shape spanning to a first dimension 316 in a first direction and spanning to a second dimension 318 in a second direction perpendicular to the first direction. The first dimension 316 is longer than the second dimension 318. So the first and second dimensions (316 and 318) are referred to as a longer pitch and a shorter pitch, respectively. Furthermore, two perpendicular directions are defined accordingly and are referred to as a first direction 316 and a second direction 318. The SRAM cell 300 includes a N-well (region) 320 disposed in the central portion of the cell. The SRAM cell 300 further includes a P-well (region) 322 disposed on the both sides of the N-well 320. In one embodiment, the N-Well 320 and P-well 322 are extended to multiple cells beyond the unit cell boundary.

Various fin active regions are defined in the substrate by isolation features and are isolated from each other by the isolation features. The isolation features are formed in the substrate with a proper technology, such as STI. In one embodiment, the SRAM cell 300 includes first active region 326 and second active region 330 formed in the P-well 322. Particularly, the first active region 326 for nFinFETs includes two or more fin-like active features. Similarly, the second active region 330 for nFinFETs includes two or more fin-like active features. The SRAM cell 300 further includes a third active region 332 and a fourth active region 334 formed in the N-well 220. Each of the third active region 332 and the fourth active region 334 includes only one fin-like active feature. The first to fourth active regions are disposed along the second dimension and may be extended to multiple cells. In one embodiment, the first and the second active regions are extended to 4 or more cells in the second direction 318. In the present embodiment, each active region in the P-well 322 includes a pull-down device and a pass-gate device.

In one embodiment, the first active region 326 includes the first pull-down device (PD-1) and the first pass-gate device (PG-1) that are cascaded. The source of PG-1 is electrically connected to the drain of the PD-1. Particularly, PD-1 is disposed in a first portion of the first active region 326 while PG-1 is disposed in a second portion of the first active region 326. Similarly, the second active region 330 includes the second pull-down device (PD-2) and the second pass-gate device (PG-2) that are cascaded. The source of PG-2 is electrically connected to the drain of the PD-2. Particularly, PG-2 is disposed in a first portion of the second active region 330 while PD-2 is disposed in a second portion of the second active region 330. The third active region 332 includes the first pull-up device (PU-1) and the fourth active region 334 includes the second pull-up device (PU-2).

In the present embodiment, each of the pass-gate devices and the pull-down devices includes two or more nFinFETs and each of the pull-up devices includes only a single pFinFET.

Various gate features are formed within the SRAM cell 300 for various nFinFETs and pFinFETs. In one embodiment, the SRAM cell 300 includes a first gate feature 336 disposed in the cell region 312 and extended in the first direction over the first active region 326 and the third active region 332, forming the gates for PD-1 and PU-1. The SRAM cell 300 includes a second gate feature 338 disposed in the cell region 312 and extended in the first direction over the second active region 330 and the fourth active region 334, forming the gates for PD-2 and PU-2. The SRAM cell 300 includes other gate features for the pass-gate devices. In one embodiment, the SRAM cell 300 includes a gate feature 340 disposed over the first active region 326, forming the gate for PG-1. The cell 300 also includes a gate feature 344 disposed over the second active region 330, forming the gate for PG-2.

In one embodiment of the configuration as illustrated in FIG. 12, the first and the second active regions in the P-well 322 and the associated pull-down devices and pass-gate devices are symmetrically disposed on the two sides of the N-well 320. The pull-down devices and pass-gate devices are tuned to have different threshold voltages to address the issues, such as current crowding issue, discussed in the background. The pull-down devices (PD-1 and PD-2) are designed to have a second threshold voltage Vt2. The pass-gate devices (PG-1 and PG-2) are designed to have the second threshold voltage Vt2 as well in this example. In the present embodiment, The threshold voltages Vt1 for the SRAM cell 200) and Vt2 (the SRAM cell 300) are tuned by applying different threshold voltage related implantations to the pull-down devices and pass-gate devices, respectively.

With further reference to FIG. 13, illustrated is a top view of the SRAM cell 300 including interconnect routings. Various interconnect structures may be utilized to couple the nFinFETs and pFinFETs to form the functional SRAM cell. In one embodiment, the drain of PD-1 is electrically connected to the source of PG-1 by sharing a common doped region, a region defined in the first active region 326 and positioned between the PD-1 and PG-1.

In another embodiment, the drain of PD-1 is electrically connected to the source of PG-1 by a silicide feature (not shown) formed on the common doped region within the first active region 326. The silicide feature is formed by a process known in the art such as self-aligned silicide (salicide) and can be formed together with other contact silicide in a same processing procedure. In another embodiment, a contact is designed to land on both the drain of PD-1 and the source of PG-1. In yet another embodiment, the drain of PD-1 and the source of PG-1 share a common region. Similarly, the drain of PD-2 and the source of PG-2 are electrically connected in a way similar to the connection between the drain of PD-1 and the source of PG-1, such as by a silicide feature.

The drains (drain node) of PD-1 and PU-1 are electrically connected using a first interconnect feature, defining a first data node (node 1 or data node). Similarly, the drains (drain node) of PD-2 and PU-2 are electrically connected using a second interconnect feature, defining a second data node (node 2 or data node bar). The first interconnect feature and the second interconnect feature are formed in a same interconnect layer (referred to as first interconnect layer) by a same processing procedure. The first and second interconnect features may be a silicide feature.

Various contacts 348 (illustrated as a rectangle with an "X") are formed on gates, drain nodes, and various landing pads. The various contacts are designed as a square or rectangle in a top view. For example, a contact is designed as a rectangle oriented in the second direction 318 such that the contact lands on both the first gate feature 336 and the drain of the PU-2. Similarly, another contact is designed as a rectangle oriented in the second direction 318 such that the contact lands on both the second gate feature 338 and the drain of the PU-1.

Figure 14:
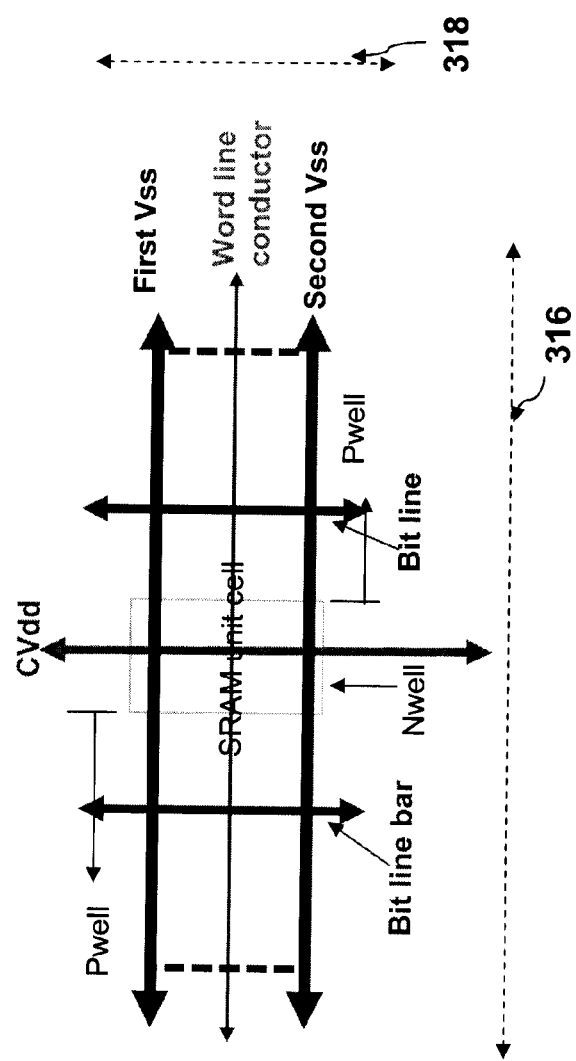
FIGS. 14 and 15 are schematic views of an interconnect structure constructed according to various aspects of the present disclosure in various embodiments.
Figure 15:
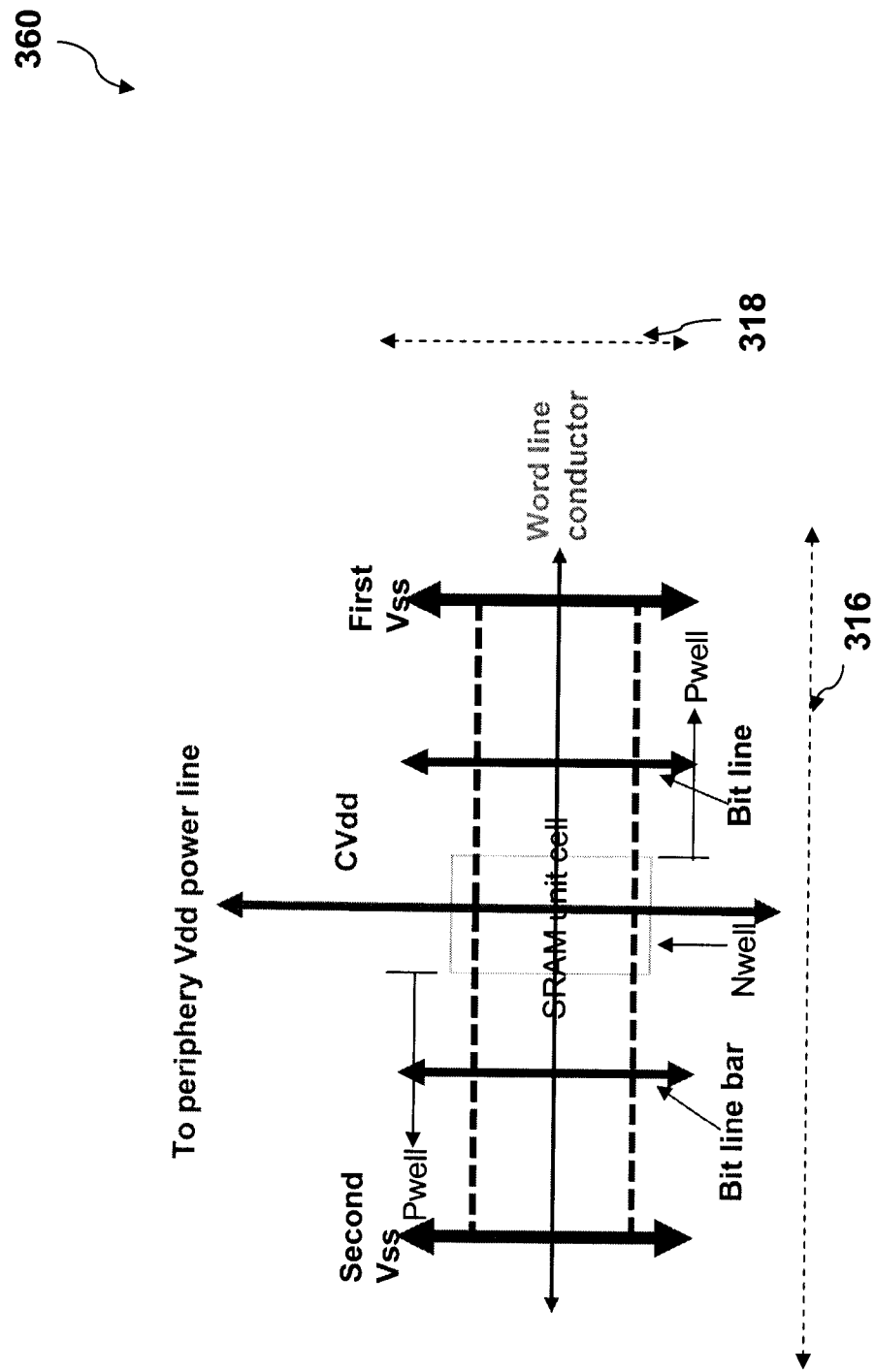

FIGS. 14 and 15 illustrate various interconnect features formed on and coupled with the SRAM cell 300. In contrast to one embodiment of the SRAM cell 200, the SRAM cell 300 does not connect to a voltage control circuitry connected.

In one embodiment illustrated in FIG. 14, various interconnect features associated with the SRAM cell 300 include various metal lines oriented in the second direction 318 and formed in a same metal layer. In one example as labeled in FIG. 14, one metal line is a power line for Vdd coupled to the source of the pull-up devices, one metal line is a bit line coupled to the drain of PU-2, and another metal line is a bit line coupled to the drain of PU-1. The metal lines in this metal layer may be coupled to the corresponding landing features through corresponding contacts 348.

The SRAM cell 300 further includes various interconnect features, such as various metal lines oriented in the first direction 316 and formed in a same metal layer as illustrated in FIG. 14. One metal line is connected to a power line (or complimentary power line) for first Vss and another metal line is connected to a power line for second Vss. The metal lines in this metal layer may be coupled to the corresponding landing features through corresponding contacts 348 or the underlying metal layer.

In another one embodiment illustrated in FIG. 15, the SRAM cell 300 includes various interconnect features, such as various metal lines oriented in the second direction 318 and formed in a same metal layer. In one example as labeled in FIG. 15, one metal line is a power line for Vdd coupled to the source of the pull-up devices, one metal line is a bit line coupled to the drain of PU-2, and another metal line is a bit line coupled to the drain of PU-1. One metal line is connected to a power line (or complimentary power line) for first Vss and another metal line is connected to a power line for second Vss. The metal lines in this metal layer are coupled to the corresponding landing features through corresponding contacts 348.

Figure 16:
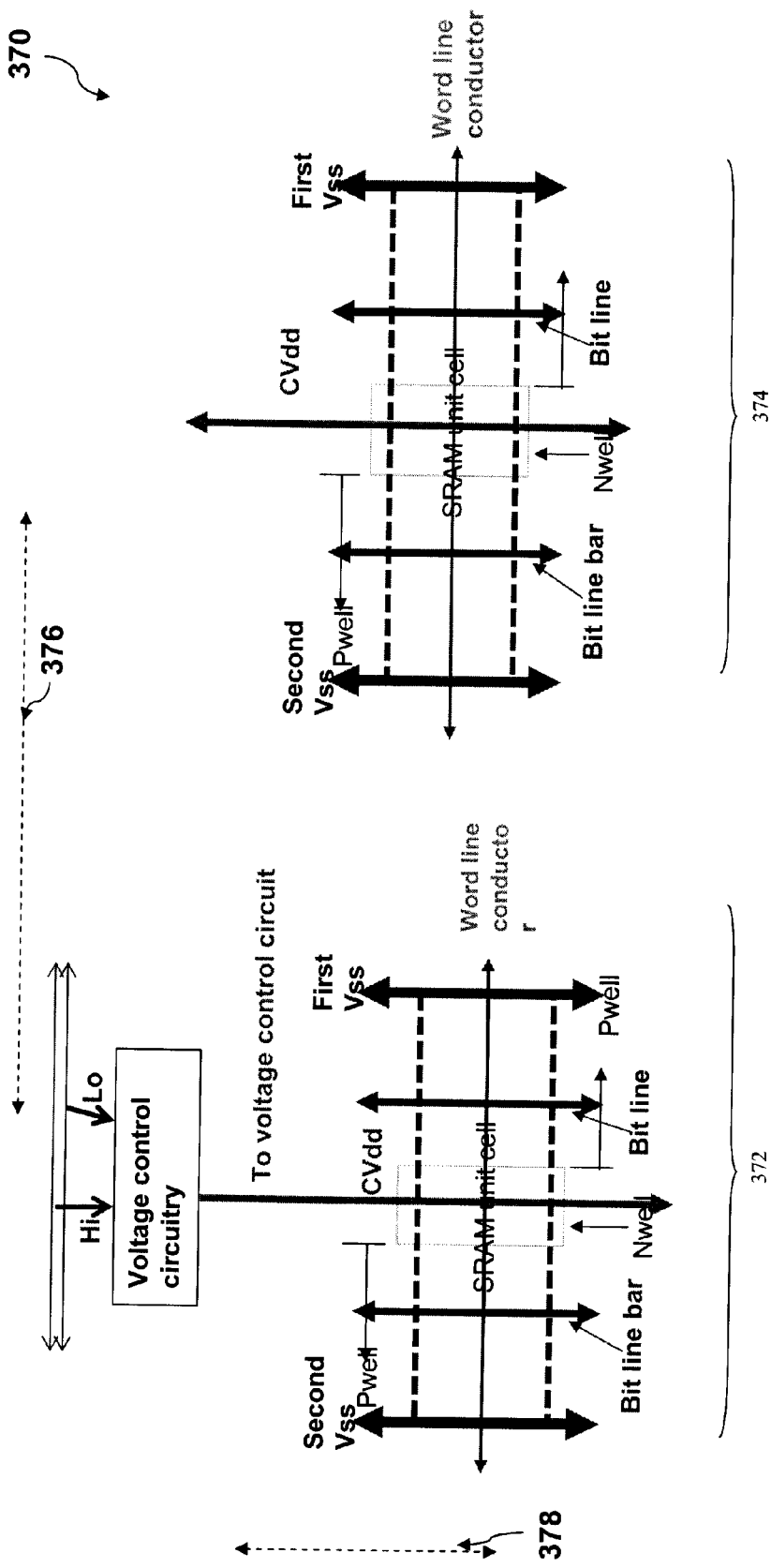
FIG. 16 is a schematic view of an interconnect structure constructed according to various aspects of the present disclosure in another embodiment.

FIG. 16 illustrates an interconnect structure 370 formed on the SRAM cell 200 and the SRAM cell 300 according to another embodiment. The interconnect structure 370 includes interconnect features 372 formed on the SRAM cell 200 and interconnect feature 374 formed on the SRAM cell 300. The interconnect structure 370 spans in a first direction 376 and a second direction 378 perpendicular to the first direction 376.

The interconnect features 372 are coupled with the SRAM cell 200 and include various metal lines oriented in the second direction 378 and formed in a same metal layer. In one example, one metal line is a power line for Vdd coupled to the source of the pull-up devices, one metal line is a bit line coupled to the drain of PU-2, and another metal line is a bit line coupled to the drain of PU-1. One metal line is connected to a power line (or complimentary power line) for first Vss and another metal line is connected to a power line for second Vss. The metal lines in this metal layer are coupled to the corresponding landing features through corresponding contacts 248.

Furthermore, the SRAM cell 200 includes a voltage control circuitry connected to the pull-up devices. Particularly, the voltage control circuitry is connected to a high voltage power line and a low voltage power line as illustrated. The voltage control circuitry is operable to switch between the high voltage and the low voltage during a read operation and a write operation, respectively. The voltage control circuitry is further connected to the pull-up devices through one of metal lines, as illustrated in FIG. 16.

The interconnect features 374 for the SRAM cell 300 include various metal lines oriented in the second direction 378 and formed in a same metal layer. In one example, one metal line is a power line for Vdd coupled to the source of the pull-up devices, one metal line is a bit line coupled to the drain of PU-2, and another metal line is a bit line coupled to the drain of PU-1. One metal line is connected to a power line (or complimentary power line) for first Vss and another metal line is connected to a power line for second Vss. The metal lines in this metal layer are coupled to the corresponding landing features through corresponding contacts 348. In the above description in the various figures regarding the various devices of the SRAM cell 200 and the SRAM cell 300. Each cell includes the first pull-up device and the second pull-up device, respectively. The terms "the first" and "the second" are used for each of them and should be clear regarding to the context. The first pull-down device and the second pull-down device are used in a similar way. The first pass-gate device and the second pass-gate device are used in a similar way.

Figure 17:
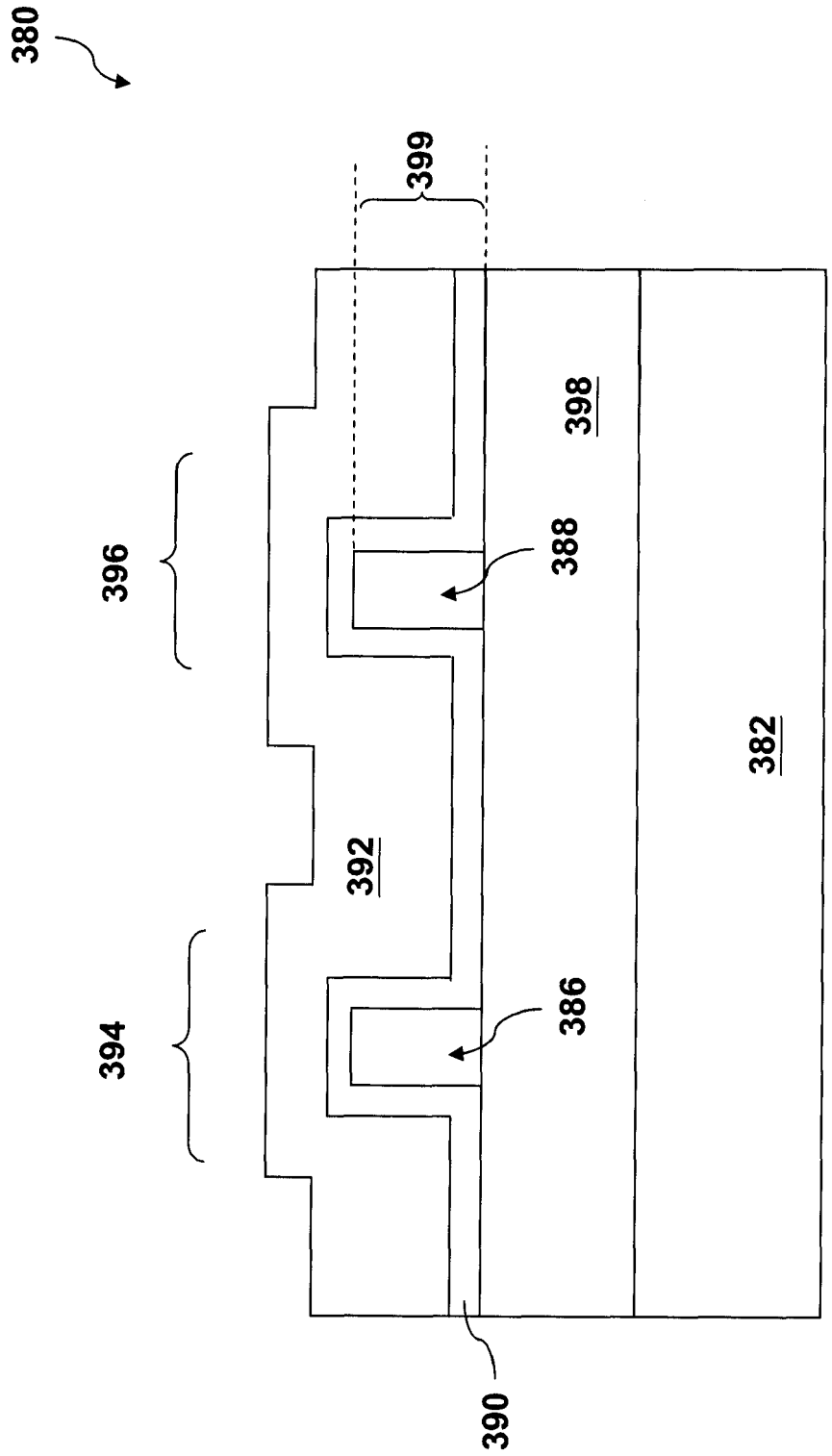
FIG. 17 is a sectional view of a semiconductor structure constructed according to various aspects of the present disclosure in various embodiments.

FIG. 17 is a sectional view of the semiconductor structure 380 according to another embodiment. The semiconductor structure 380 is a portion of the integrated circuit 10 in FIG. 1. The semiconductor structure 380 illustrates two exemplary fin-like transistors in portion. The two fin-like transistors may be a portion of the first SRAM cell 14, the second SRAM cell 16, or both.

The semiconductor structure 380 includes a semiconductor substrate 382. The semiconductor substrate 382 includes silicon. Alternatively, the substrate includes germanium, silicon germanium or other proper semiconductor materials. The semiconductor substrate 382 includes a dielectric layer 398 formed on the semiconductor substrate 382 for isolation. In one example, the dielectric layer 398 includes silicon oxide. The semiconductor structure 380 includes another semiconductor layer 399, such as silicon, on the dielectric layer 398, referred to as semiconductor on insulator (SOI). The SOI structure can be formed by a proper technology, such as separation by implanted oxygen (SIMOX) or wafer bonding to include the dielectric layer inside semiconductor material.

The semiconductor layer 399 is patterned to form fin active regions 386 and 388. The fin active regions (386 and 388) and the STI features can be formed in a processing sequence including forming a patterned mask layer on the semiconductor layer and etching the semiconductor layer 399 through the openings of the patterned mask layer. The patterned mask layer can be a patterned photoresist layer or a patterned hard mask layer, such as a patterned silicon nitride layer.

Various gates are further formed on the fin active regions. A gate feature includes a gate dielectric layer 390 (such as silicon oxide) and a gate electrode 392 (such as doped polysilicon) disposed on the gate dielectric layer 390. In one embodiment, the gate dielectric layer includes high-k dielectric material layer. The gate electrode includes metal, such as aluminum, copper, tungsten, or other proper conductive material. In the present embodiment for illustration, the semiconductor structure 380 includes a first region 394 for one or more FinFETs and a second region 396 for one or more FinFETs. In one example, the active region 386 is an active region in the n-well for one or more pFinFETs and the active region 388 is an active region in the p-well for one or more nFinFETs.

In one embodiment, the processing flow to form a SRAM cell, including the pass-gate and pull-down devices, includes the following steps: formation of fin active regions, well formation, channel dopant formation, additional channel doping process only to pass-gate devices, gate formation, light doped drain (LDD) formation, pocket implant (pocket junction) formation, gate spacer formation, source/drain (S/D) dopant formation, silicide formation, and interconnection formation. In the additional channel doping process, the additional channel dopant is introduced to the channels of the pass-gate devices, increasing the beta ratio of the SRAM cell.

In another embodiment, the processing flow to form a SRAM cell includes the following steps: formation of fin active regions, well formation, channel dopant formation, gate formation, light doped drain (LDD) formation, pocket implant (pocket junction) formation, additional pocket doping process only to pass-gate devices, gate spacer formation, source/drain (S/D) dopant formation, silicide formation, and interconnection formation. In the additional pocket doping process, the additional pocket dopant is introduced to the channel edges of the pass-gate devices, increasing the beta ratio of the SRAM cell. Other embodiments of a SRAM cell and the corresponding method are provided and described below according to various aspects of the present disclosure.

In various embodiments, the disclosed SRAM device addresses the issues noted in the background. In one example, by performing different threshold voltage tuning processes to different SRAM cells, high packing density SRAM cells and high current SRAM cells are formed on a same substrate. In another example, by coupling a voltage control circuit to the pull-up devices of a high packing density SRAM cell, the circuit is capable of maintaining both read stability and write margin with enhanced SRAM performance. In another example, the disclosed method and the SRAM structure simplify the wafer manufacturing and reduce the manufacturing cost.

Thus, the present disclosure provides one embodiment of an integrated circuit formed in a semiconductor substrate. The integrated circuit includes a first static random access memory (SRAM) cell having a first cell size; and a second SRAM cell having a second cell size greater than the first cell size. The first SRAM cell includes first n-type field effect transistors (nFETs) each having a first gate stack, and the second SRAM cell includes second nFETs each having a second gate stack different from the first gate stack.

In one embodiment, the second gate stack is different from the first gate stack in at least one of gate electrode material, gate dielectric material and gate dielectric thickness.

In another embodiment, the first SRAM cell includes a first number N1 of the first nFETs; the second SRAM cell includes a second number N2 of the second nFETs; and the second number N2 is greater than the first number N1.

In yet another embodiment, the first SRAM cell includes first two pull-up devices; first two pull-down devices configured with the first two pull-up devices to form first two cross-coupled inverters for data storage; and first two pass-gate devices configured with the first two cross-coupled inverters to form first ports for data access. In the embodiment, the second SRAM cell includes second two pull-up devices; second two pull-down devices configured with the second two pull-up devices to form second two cross-coupled inverters for data storage; and second two pass-gate devices configured with the second two cross-coupled inverters to form second ports for data access. The first and second SRAM cells each include a plurality of fin-like field-effect transistors (FinFETs).

In furtherance of the above embodiment, each of the first two pull-up devices and the second two pull-up devices includes a single p-type fin-like field-effect transistor (pFinFET); each of the first two pull-down devices and the first two pass-gate devices includes a single n-type FinFET (nFinFET); and each of the second two pull-down devices and the second two pass-gate devices includes a plurality of n-type FinFETs (nFinFETs). In yet another embodiment, the integrated circuit further includes a write-assist circuitry connected to the first two pull-up devices.

In another embodiment, the first SRAM cell has a first alpha ratio ranging within 0.8 and 1.3; and the second SRAM cell has a second alpha ratio ranging within 0.2 and 0.6. In yet another embodiment, the first nFETs each include a first p-type well (p-well) and a first channel region; the second nFETs each include a second p-type well (p-well) and a second channel region; and at least one of the first p-well and the first channel is different from respective one of the second p-well and the second channel.

The present disclosure also provides another embodiment of an integrated circuit. The integrated circuit includes a first static random access memory (SRAM) cell having a first cell size on a substrate. The first SRAM cell includes first and second pull-up devices each having only one of first p-type field effect transistors (pFETs); first and second pull-down devices configured with the first and second pull-up devices to form first two cross-coupled inverters for data storage; and first and second pass-gate devices configured with the first two cross-coupled inverters for data access, wherein the first and second pull-down device and the first and second pass-gate devices each include only one of first n-type field effect transistors (nFETs). The integrated circuit also includes a second SRAM cell on the substrate, having a second cell size greater than the first cell size. The second SRAM cell includes third and fourth pull-up devices each having only one of second pFETs; third and fourth pull-down devices configured with the third and fourth pull-up devices to form second two cross-coupled inverters for data storage; and third and fourth pass-gate devices configured with the second two cross-coupled inverters for data access, wherein the third and fourth pull-down device and the third and fourth pass-gate devices each include at least two of second nFETs. The second nFETs are different from the first nFETs.

In one embodiment of the integrated circuit, the first nFETs have a first threshold voltage, and the second nFETs have a second threshold voltage different from the first threshold voltage.

In another embodiment, the first nFETs each include a first gate stack, and the second nFETs each include a second gate stack different from the first gate stack in at least one of gate electrode material, gate dielectric material and gate dielectric thickness.

In yet another embodiment, the second nFETs are different from the first nFETs in at least one of channel doping concentration, p-well dimension and p-well doping concentration.

In yet another embodiment, the first nFETs each include a first n-type light doped drain (NLDD) feature and a first pocket doping feature adjacent the first NLDD feature, the second nFETs each include a second NLDD feature and a second pocket doping feature adjacent the second NLDD feature, and at least one of the first NLDD feature and the first pocket doping feature is different from respective one of the second NLDD feature and the second pocket doping feature.

In yet another embodiment, the first pFETs each include a first gate stack, and the second pFETs each include a second gate stack different from the first gate stack in at least one of gate electrode material, gate dielectric material and gate dielectric thickness.

In another embodiment, the second cell size is at least 10% greater than the first cell size. In yet another embodiment, the integrated circuit further includes a write-assist circuitry connected to the first and second pull-up devices. In yet another embodiment, the first SRAM cell has a first alpha ratio ranging within 0.8 and 1.3; and the second SRAM cell has a second alpha ratio ranging within 0.2 and 0.6.

The present disclosure also provide one embodiment of a method. The method includes forming a first static random access memory (SRAM) cell of a first cell size on a substrate, wherein the forming of the first SRAM cell includes forming first n-type fin field-effect transistors (nFinFETs) using a first nFinFET formation process; and forming a second SRAM cell of a second cell size on the substrate, wherein the forming of the second SRAM cell includes forming second nFinFETs using a second nFinFET formation process different from the first nFinFET formation process. The second cell size is greater than the first cell size.

In one embodiment of the method, the first nFinFET formation process includes forming a first p-well using a first p-well doping dose and with a first p-well dimension; forming a first channel region in the first p-well using a first channel doping dose; forming a first-type light doped drain (NLDD) feature in the first p-well and interposed by the first channel region, using a first NLDD doping dose; forming a first pocket doping feature adjacent the first NLDD feature using a first pocket doping dose; forming a first gate dielectric layer on the first channel region, with a first gate dielectric material and a first gate dielectric thickness; and forming a first gate electrode on the first gate dielectric layer using a first gate electrode material. The second nFinFET formation process includes forming a second p-well using a second p-well doping dose and with a second p-well dimension; forming a second channel region in the second p-well using a second channel doping dose; forming a second-type light doped drain (NLDD) feature in the second p-well and interposed by the second channel region, using a second NLDD doping dose; forming a second pocket doping feature adjacent the second NLDD feature using a second pocket doping dose; forming a second gate dielectric layer on the second channel region, with a second gate dielectric material and a second gate dielectric thickness; and forming a second gate electrode on the second gate dielectric layer using a second gate electrode material. At least one of the first p-well doping dose, the first p-well dimension, the first channel doping dose, the first NLDD doping dose, the first pocket doping dose, the gate dielectric material, the first gate dielectric thickness and the first gate electrode material is different from respective one of the second p-well doping dose, the second p-well dimension, the second channel doping dose, the second NLDD doping dose, the second pocket doping dose, the gate dielectric material, the second gate dielectric thickness and the second gate electrode material.

In another embodiment, the method further includes forming a write assist circuitry. The forming of the first SRAM cell includes forming first p-type fin field-effect transistors (pFinFETs); the forming of the second SRAM cell includes forming second pFinFETs; and the forming of the write assist circuitry includes forming the write assist circuitry connected to the first pFinFETs.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit formed in a semiconductor substrate, comprising:
a first static random access memory (SRAM) cell having a first cell size; and
a second SRAM cell having a second cell size greater than the first cell size, wherein:
the first SRAM cell includes first n-type field effect transistors (nFETs) each having a first gate stack, and
the second SRAM cell includes second nFETs each having a second gate stack different from the first gate stack, wherein the second gate stack is different from the first gate stack in at least one of gate electrode material, gate dielectric material, and gate dielectric thickness.

2. The integrated circuit of claim 1, wherein:
the first SRAM cell includes a first number N1 of the first nFETs;
the second SRAM cell includes a second number N2 of the second nFETs; and
the second number N2 is greater than the first number N1.

3. The integrated circuit of claim 1, wherein:
the first SRAM cell includes:
first two pull-up devices,
first two pull-down devices configured with the first two pull-up devices to form first two cross-coupled inverters for data storage, and
first two pass-gate devices configured with the first two cross-coupled inverters to form first ports for data access;
the second SRAM cell includes:
second two pull-up devices,
second two pull-down devices configured with the second two pull-up devices to form second two cross-coupled inverters for data storage; and
second two pass-gate devices configured with the second two cross-coupled inverters to form second ports for data access; and
wherein the first and second SRAM cells each include a plurality of fin-like field-effect transistors (FinFETs).

4. The integrated circuit of claim 3, wherein:
each of the first two pull-up devices and the second two pull-up devices includes a single p-type fin-like field-effect transistor (pFinFET);
each of the first two pull-down devices and the first two pass-gate devices includes a single n-type FinFET (nFinFET); and
each of the second two pull-down devices and the second two pass-gate devices includes a plurality of n-type FinFETs (nFinFETs).

5. The integrated circuit of claim 4, further comprising a write-assist circuitry connected to the first two pull-up devices.

6. The integrated circuit of claim 1, wherein:
the first SRAM cell has a first alpha ratio ranging within 0.8 and 1.3; and
the second SRAM cell has a second alpha ratio ranging within 0.2 and 0.6.

7. The integrated circuit of claim 1, wherein:
the first nFETs each include a first p-type well (p-well) and a first channel region;
the second nFETs each include a second p-type well (p-well) and a second channel region; and
at least one of the first p-well and the first channel is different from respective one of the second p-well and the second channel.

8. An integrated circuit, comprising:
a first static random access memory (SRAM) cell having a first cell size on a substrate, wherein the first SRAM cell includes:

first and second pull-up devices each having only one of first p-type field effect transistors (pFETs), first and second pull-down devices configured with the first and second pull-up devices to form first two cross-coupled inverters for data storage, and first and second pass-gate devices configured with the first two cross-coupled inverters for data access, wherein the first and second pull-down devices and the first and second pass-gate devices each include only one of first n-type field effect transistors (nFETs); and a second SRAM cell on the substrate having a second cell size greater than the first cell size, wherein the second SRAM cell includes:

third and fourth pull-up devices each having only one of second pFETs, third and fourth pull-down devices configured with the third and fourth pull-up devices to form second two cross-coupled inverters for data storage, and third and fourth pass-gate devices configured with the second two cross-coupled inverters for data access, wherein the third and fourth pull-down devices and the third and fourth pass-gate devices each include at least two of second nFETs, wherein the second nFETs are different from the first nFETs.

9. The integrated circuit of claim 8, wherein:
the first nFETs have a first threshold voltage, and
the second nFETs have a second threshold voltage different from the first threshold voltage.

10. The integrated circuit of claim 8, wherein
the first nFETs each include a first gate stack, and
the second nFETs each include a second gate stack different from the first gate stack in at least one of gate electrode material, gate dielectric material, and gate dielectric thickness.

11. The integrated circuit of claim 8, wherein the second nFETs are different from the first nFETs in at least one of channel doping concentration, p-well dimension, and p-well doping concentration.

12. The integrated circuit of claim 8, wherein:
the first nFETs each include a first n-type light doped drain (NLDD) feature and a first pocket doping feature adjacent the first NLDD feature;
the second nFETs each include a second NLDD feature and a second pocket doping feature adjacent the second NLDD feature; and
at least one of the first NLDD feature and the first pocket doping feature is different from respective one of the second NLDD feature and the second pocket doping feature.

13. The integrated circuit of claim 8, wherein:
the first pFETs each include a first gate stack; and
the second pFETs each include a second gate stack different from the first gate stack in at least one of gate electrode material, gate dielectric material, and gate dielectric thickness.

14. The integrated circuit of claim 8, wherein the second cell size is at least 10% greater than the first cell size.

15. The integrated circuit of claim 8, further comprising a write-assist circuitry connected to the first and second pull-up devices.

16. The integrated circuit of claim 8, wherein:
the first SRAM cell has a first alpha ratio ranging within 0.8 and 1.3; and
the second SRAM cell has a second alpha ratio ranging within 0.2 and 0.6.

17. An integrated circuit formed in a semiconductor substrate, comprising:
a first static random access memory (SRAM) cell having:
first two pull-up devices,
first two pull-down devices configured with the first two pull-up devices to form first two cross-coupled inverters for data storage, and
first two pass-gate devices configured with the first two cross-coupled inverters to form first ports for data access; and
a second SRAM cell having:
second two pull-up devices,
second two pull-down devices configured with the second two pull-up devices to form second two cross-coupled inverters for data storage; and
second two pass-gate devices configured with the second two cross-coupled inverters to form second ports for data access; and
wherein:
the first two pull-down devices and the first two pass-gate devices each include a first number of first n-type field effect transistors (nFETs)
the second two pull-down devices and the second two pass-gate devices each include a second number of second nFETs;
the first number is smaller than the second number; and
the first nFETs are different from the second nFETs.

18. The integrated circuit of claim 17, wherein the first nFETs are different from the second nFETs in at least one of: gate stack, channel doping concentration, p-well dimension, and p-well doping concentration.

19. The integrated circuit of claim 17, wherein:
the first two pull-up devices each include only one of first p-type field effect transistors (pFETs);
the second two pull-up devices each include only one of second pFETs; and
the first and second pFETs have different gate stacks.

20. The integrated circuit of claim 17, wherein the first SRAM cell has a first cell size and the second SRAM cell has a second cell size, and
wherein the second cell size is at least 10% greater than the first cell size.

* * * * *